United States Patent
Sakai et al.

(10) Patent No.: US 10,571,486 B2
(45) Date of Patent: Feb. 25, 2020

(54) TRANSFER UNIT AND PROBER

(71) Applicant: Tokyo Seimitsu Co., Ltd., Tokyo (JP)

(72) Inventors: Kentaro Sakai, Tokyo (JP); Takekiyo Ichikawa, Tokyo (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 15/952,209

(22) Filed: Apr. 12, 2018

(65) Prior Publication Data
US 2018/0231582 A1 Aug. 16, 2018

Related U.S. Application Data

(63) Continuation of application No. PCT/JP2016/060791, filed on Mar. 31, 2016.

(30) Foreign Application Priority Data

Feb. 26, 2016 (JP) .................................. 2016-036052

(51) Int. Cl.
*G01R 1/067* (2006.01)
*H01L 21/677* (2006.01)
(Continued)

(52) U.S. Cl.
CPC ........... *G01R 1/06705* (2013.01); *G01R 1/44* (2013.01); *G01R 31/2867* (2013.01); *H01L 21/677* (2013.01)

(58) Field of Classification Search
CPC ...... G01R 1/06788; G01R 3/00; G01R 1/067; C08F 10/00; C08F 2/00
(Continued)

(56) References Cited

U.S. PATENT DOCUMENTS 6,249,132 B1 * 6/2001 Amemiya .......... G01R 31/2893
324/750.08
6,356,338 B2 * 3/2002 Arakawa ................ G03B 27/52
118/719
(Continued)

FOREIGN PATENT DOCUMENTS

JP 02-085056 A 3/1990
JP 03-289152 A 12/1991
(Continued)

OTHER PUBLICATIONS

Tokyo Seimitsu Co. Ltd., International Preliminary Report on Patentability, PCT/JP2016/060791, dated Jan. 30, 2017, 12 pgs.
(Continued)

*Primary Examiner* — Christopher P McAndrew
(74) *Attorney, Agent, or Firm* — Morgan, Lewis & Bockius LLP

(57) ABSTRACT

The present invention provides a prober and a transfer unit being capable of improving throughput at each of the measurement units. The prober includes a transfer object housing that houses a plurality of transfer objects, the plurality of measurement units, the transfer unit that moves between the transfer object housing for housing the plurality of transfer objects and the plurality of measurement units to transfer the transfer objects into the transfer object housing or each of the measurement units, and a moving device. The transfer unit includes environment controller configured to control an environment in a casing, and air curtain formation means for causing the casing to be in a sealed or a substantially sealed state.

16 Claims, 8 Drawing Sheets

(51) Int. Cl.
*G01R 1/44* (2006.01)
*G01R 31/28* (2006.01)

(58) Field of Classification Search
USPC .......................................................... 324/149
See application file for complete search history.

(56) References Cited

U.S. PATENT DOCUMENTS

| | | | |
|---|---|---|---|
| 9,406,537 B2* | 8/2016 | Oyama | H01L 21/67373 |
| 9,460,949 B2* | 10/2016 | Chou | H01L 21/67393 |
| 9,583,352 B2* | 2/2017 | Tsai | H01L 21/67253 |
| 9,960,065 B2* | 5/2018 | Kawasaki | H01L 21/67253 |
| 2002/0009658 A1* | 1/2002 | Sato | G01N 21/9501 |
| | | | 430/30 |
| 2002/0050572 A1* | 5/2002 | Nagahashi | G03F 7/70858 |
| | | | 250/492.1 |
| 2002/0088780 A1* | 7/2002 | Boyle | B23K 26/40 |
| | | | 219/121.69 |
| 2002/0155647 A1* | 10/2002 | Nishiki | H01L 21/67017 |
| | | | 438/155 |
| 2007/0151620 A1* | 7/2007 | Okabe | H01L 21/67017 |
| | | | 141/63 |
| 2008/0240891 A1 | 10/2008 | Obikane | |
| 2011/0242508 A1* | 10/2011 | Kobayashi | H01L 21/67109 |
| | | | 355/27 |
| 2012/0083918 A1* | 4/2012 | Yamazaki | H01L 21/67389 |
| | | | 700/112 |
| 2013/0241588 A1* | 9/2013 | Yamada | G01R 31/2601 |
| | | | 324/750.24 |
| 2015/0219687 A1 | 8/2015 | Furuya et al. | |
| 2015/0357213 A1* | 12/2015 | Yokoyama | H01L 21/67086 |
| | | | 438/747 |
| 2016/0109508 A1* | 4/2016 | Akaike | G01R 31/2874 |
| | | | 324/750.03 |

FOREIGN PATENT DOCUMENTS

| | | |
|---|---|---|
| JP | 05-136219 A | 6/1993 |
| JP | 05-343497 A | 12/1993 |
| JP | 05343486 A | 12/1993 |
| JP | 10-289934 A | 10/1998 |
| JP | 11-186348 A | 7/1999 |
| JP | H11-214475 A | 8/1999 |
| JP | 2000150596 A | 5/2000 |
| JP | 2001127138 A | 5/2001 |
| JP | 2002026107 A | 1/2002 |
| JP | 2002313867 A | 10/2002 |
| JP | 2002353287 A | 12/2002 |
| JP | 2007180517 A | 7/2007 |
| JP | 2007294665 A | 11/2007 |
| JP | 2007324508 A | 12/2007 |
| JP | 2008084935 A | 4/2008 |
| JP | 2008103528 A | 5/2008 |
| JP | 2008-251678 A | 10/2008 |
| JP | 2012248887 A | 12/2012 |
| JP | 2013-156084 A | 8/2013 |
| JP | 2013191737 A | 9/2013 |
| JP | 2014-029917 A | 2/2014 |
| JP | 2014130898 A | 7/2014 |
| JP | 2014150168 A | 8/2014 |
| JP | 2014209536 A | 11/2014 |

OTHER PUBLICATIONS

Tokyo Seimitsu Co. Ltd., Notification of Reasons for Refusal, JP 2016-036053, drafted Apr. 21, 2016, dated Apr. 26, 2016, 5 pgs.
Tokyo Seimitsu Co. Ltd., Notification of Reasons for Refusal, JP 2016-135112, drafted Jul. 25, 2016, dated Jul. 27, 2016, 6 pgs.
Tokyo Seimitsu Co. Ltd., Notification of Reasons for Refusal, JP 2016-197948, drafted Oct. 24, 2016, dated Oct. 27, 2016, 4 pgs.
Tokyo Seimitsu Co. Ltd., Notification of Reasons for Refusal, JP 2017-001920, drafted Feb. 2, 2017, dated Feb. 6, 2017, 4 pgs.
Tokyo Seimitsu Co. Ltd., Notification of Reasons for Refusal, JP 2017-001920, drafted Jun. 15, 2017, dated Jun. 20, 2017, 8 pgs.
Tokyo Seimitsu Co. Ltd., Notification of Reasons for Refusal, JP 2016-036054, drafted Apr. 21, 2016, dated Apr. 25, 2016, 4 pgs.
Tokyo Seimitsu Co. Ltd., Notification of Reasons for Refusal, JP 2016-131378, drafted Jul. 14, 2016, dated Jul. 20, 2016, 6 pgs.
Tokyo Seimitsu Co. Ltd., Decision to Grant a Patent, JP 2016-036053, drafted Jun. 7, 2016, dated Jun. 10, 2016, 6 pgs.
Tokyo Seimitsu Co. Ltd., Decision to Grant a Patent, JP 2016-135112, drafted Sep. 2, 2016, dated Sep. 6, 2016, 6 pgs.
Tokyo Seimitsu Co. Ltd., Decision to Grant a Patent, JP 2016-197948, drafted Dec. 7, 2016, dated Dec. 9, 2016, 6 pgs.
Tokyo Seimitsu Co. Ltd., Decision to Grant a Patent, JP 2017-001920, drafted Oct. 18, 2017, dated Oct. 23, 2017, 6 pgs.
Tokyo Seimitsu Co. Ltd., Decision to Grant a Patent, JP 2016-036054, drafted Jun. 7, 2016, dated Jun. 10, 2016, 6 pgs.
Tokyo Seimitsu Co. Ltd., Decision to Grant a Patent, JP 2016-131378, drafted Aug. 23, 2016, dated Aug. 25, 2016, 6 pgs.
Notice of Reasons for Refusal, Japanese Patent Application No. 2016-184639, dated Oct. 9, 2019, 6 pgs.
Notification of Reasons for Refusal, JP Patent App. No. 2017-222436, dated Oct. 3, 2019, 10 pgs.
Notification of Reasons for Refusal, Japanese Patent Application No. 2016-036052, dated Nov. 27, 2019, 6 pgs.
Decision of Refusal, JP 2016-184639, Dec. 20, 2019, 4 pgs.

* cited by examiner

TRANSFER UNIT AND PROBER

CROSS-REFERENCE TO RELATED APPLICATIONS

This application is a Continuation of PCT International Application No. PCT/JP2016/060791 filed on Mar. 31, 2016, which claims priority under 35 U.S.C. § 119(a) to Japanese Patent Application No. 2016-036052 filed on Feb. 26, 2016. Each of the above application(s) is hereby expressly incorporated by reference, in its entirety, into the present application.

BACKGROUND OF THE INVENTION

Field of the Invention

The present invention relates to a prober that inspects electrical characteristics of a plurality of semiconductor elements (chips) formed on a semiconductor wafer, and particularly, to a prober equipped with a transfer unit that moves between a transfer object housing (storage) and a plurality of measurement units to transfer a transfer object to the transfer object housing or each of the measurement units.

Description of the Related Art

Conventionally, a prober (wafer inspection apparatus) has been proposed that is provided with a transfer object housing (cassette stock unit for housing a plurality of wafers) that houses a plurality of transfer objects (objects to be transferred), a plurality of measurement units (wafer inspection units), and a transfer unit (self-propelled chassis) that moves between the transfer object housing and each of the measurement units to transfer a transfer object to the transfer object housing or each of the measurement units (e.g., see Patent Literature 1). According to the prober described in Patent Literature 1, for example, when N measurement units are used, an inspection time can be reduced to 1/N compared to a case where one measurement unit is used.

Conventionally, probers conduct an inspection (high temperature inspection or low temperature inspection) of electrical characteristics of a wafer at a high temperature (or low temperature). This inspection is normally conducted following a procedure in which a wafer is transferred from a cassette to a wafer chuck using a transfer arm, the wafer is heated (or cooled) to an inspection temperature on the wafer chuck, electrical characteristics of the wafer are inspected, and after completion of the inspection, the wafer is cooled (or heated) on the wafer chuck and the wafer is returned to the cassette using the transfer arm when the temperature is returned to a normal temperature.

Conventionally, a prober (wafer probing system) has been proposed which includes: a casing (card cassette) that houses a transfer object (probe card) and has an opening through which the transfer object goes in and out; an openable/closable physical door that closes the opening to cause the casing to be in a sealed or substantially sealed state; and a transfer unit (card transfer chassis) that moves to a delivery destination (prober) of the transfer object, opens the physical door and delivers the transfer object to/from the delivery destination of the transfer object through the opening (e.g., see Patent Literature 2). In the wafer probing system described in Patent Literature 2, dry air is supplied into the casing after the transfer unit is moved to the delivery destination of the transfer object, then, the physical door is opened, and the transfer object is delivered to/from the delivery destination of the transfer object through the opening.

Conventionally, a prober has been proposed which includes: an openable/closable physical door that closes an opening through which a transfer object (wafer) is delivered in and out; and a hot air blowing apparatus provided in the door to blow hot air toward the transfer object that passes through a lower part of the opening when the door is opened (e.g., see Patent Literature 3).

CITATION LIST

Patent Literature

PTL 1: Japanese Patent Application Laid-Open No. H5-343497
PTL 2: Japanese Patent Application Laid-Open No. 2007-294665
PTL 3: Japanese Patent Application Laid-Open No. H10-289934

SUMMARY OF THE INVENTION

However, when each measurement unit of the prober described in Patent Literature 1 conducts a high temperature inspection or low temperature inspection, the following problems occur due to a difference between an environment of the transfer object housing (normally, normal temperature environment) and an environment of each measurement unit (high temperature environment or low temperature environment).

For example, when a high temperature inspection is conducted, a standby time (for preheating) is necessary for each measurement unit before starting the inspection in order to cause a wafer or probe card in a normal temperature state to have a temperature near an inspection temperature, which results in a problem that throughput (processing capacity per unit time) at each measurement unit decreases. Especially after a wafer or probe card is replaced, when a high temperature inspection is conducted again, the standby time until the next high temperature inspection can be conducted is further extended because it takes time for the wafer chuck to have a high temperature again. This causes the throughput at each measurement unit to further decrease. Furthermore, when a high temperature inspection is conducted, if the wafer or probe card is replaced after completion of the inspection, each measurement unit requires a standby time to cause the wafer or probe card in a high temperature state to have a normal temperature, which also results in a problem that throughput at each measurement unit decreases.

Likewise, when a low temperature inspection is conducted, a standby time is necessary for each measurement unit in order to cause the wafer or probe card in a normal temperature state to have a temperature near an inspection temperature, which also results in a problem that throughput at each measurement unit decreases. Especially, after the wafer or probe card is replaced, when a low temperature inspection is conducted again, the standby time until the next low temperature inspection can be conducted is further extended because it takes time for the wafer chuck to have a low temperature again. This causes throughput at each measurement unit to further decrease. Furthermore, when a low temperature inspection is conducted, a standby time is necessary for each measurement unit after completion of the inspection in order to cause the wafer or probe card in a low temperature state to have a temperature near a temperature at which no condensation occurs (normally, normal temperature), which also results in a problem that throughput at each measurement unit decreases.

As described above, according to the prober described in Patent Literature 1, when each measurement unit conducts a high temperature inspection or low temperature inspection, due to a difference between an environment of the transfer object housing (normally, normal temperature environment) and an environment of each measurement unit (high temperature environment or low temperature environment), the standby time for each measurement unit to cause the transfer object to have a temperature close to a predetermined temperature (e.g., inspection temperature or normal temperature) is long, which results in a problem that throughput at each measurement unit decreases. It is necessary to solve this problem and improve throughput at each measurement unit.

Furthermore, although the prober described in Patent Literatures 2 and 3 can cause the casing that houses the transfer object to be in a sealed state, a separate mechanism for opening/closing a physical door is necessary because the opening through which the transfer object is delivered in and out has the physical door. Since it takes a certain time to open/close the physical door, there is such a problem that the transfer object cannot be delivered speedily.

The present invention has been implemented in view of the above-described circumstances, and aims to provide a prober and a transfer unit which can improve throughput at each of the measurement units, in which the prober is equipped with the transfer unit that moves between a transfer object housing and a plurality of measurement units to deliver transfer objects (e.g., at least one of a wafer and a probe card) to the transfer object housing or each of the measurement units. Furthermore, the present invention also aims to provide a prober and a transfer unit, in which the prober is equipped with a casing that houses transfer objects and includes an opening through which the transfer objects is delivered in and out, and the transfer unit that moves to a delivery destination of the transfer objects to deliver the transfer objects to/from the delivery destination of the transfer objects through the opening, the prober and the transfer unit can cause the casing housing the transfer objects to be in a sealed state, eliminate the necessity for a physical door and a mechanism for open/close the door, and speedily deliver the transfer objects.

In order to attain the above described objects, a prober according to an aspect of the present invention includes a transfer object housing that houses a plurality of transfer objects, a plurality of measurement units, a transfer unit that moves between the transfer object housing that houses the plurality of transfer objects and the plurality of measurement units to transfer the transfer objects into the transfer object housing or each of the measurement units, and a moving device that moves the transfer unit between the transfer object housing and each of the measurement units, in which the transfer unit includes a casing that houses the transfer objects, an environment controller configured to control an environment in the casing so as to become an environment according to an environment of a transfer destination of each of the transfer objects, and air curtain formation means configured to form an air curtain that closes an opening formed in the casing, through which the transfer objects go in and out and causing the casing to be in a sealed or substantially sealed state.

According to this aspect, the environment in the casing can be controlled by the environment controller, and it is thereby possible to use a step of transferring the transfer objects as a time for setting the transfer objects in a desired state (e.g., temperature and humidity) and thereby possible to improve throughput of the measurement units.

According to this aspect, the air curtain formation means closes the opening of the casing, it is thereby possible to eliminate the necessity for providing a mechanism for opening/closing a door as in the case where a physical door is attached and also reduce the time required to open/close the door.

The environment controller and the air curtain formation means are preferably provided as separate bodies.

According to this aspect, since the environment controller and the air curtain formation means are provided as separate bodies, the environment controller and the air curtain formation means can be operated individually. This aspect can control the environment in the casing more accurately.

It is preferable that the environment controller be provided on a top surface in the casing and the air curtain formation means be provided at an upper end edge of the opening of the casing.

According to this aspect, since the environment controller is provided on the top surface in the casing, the environment in the casing can be controlled more efficiently. Furthermore, according to this aspect, since the air curtain formation means is provided at the upper end edge of the opening of the casing, the opening can be closed more efficiently.

It is preferable that the environment controller and the air curtain formation means be integrally provided.

According to this aspect, since the environment controller and the air curtain formation means are integrally provided, less space is required for the environment controller and the air curtain formation means, and the space in the casing can be used effectively.

Furthermore, according to this aspect, since the environment controller and the air curtain formation means are integrally provided, for example, a temperature regulating gas supply source including a heater and a cooler, and an air blower or the like can be used in common (shared) between the environment controller and air curtain formation means.

An aspect of the present invention provides a transfer unit that moves between a transfer object housing that houses a plurality of transfer objects and a plurality of measurement units to transfer the transfer objects into the transfer object housing or each of the measurement units, and includes a casing that houses the transfer objects, an environment controller configured to control an environment in the casing so as to become an environment in accordance with an environment of a transfer destination of each of the transfer objects, and air curtain formation means configured to form an air curtain that closes an opening formed in the casing, through which the transfer objects go in and out and causing the casing to be in a sealed or substantially sealed state.

The present invention can provide a prober and a transfer unit which can improve throughput at each of the measurement units, in which the prober is equipped with the transfer unit that moves between a transfer object housing and a plurality of measurement units to transfer objects (e.g., at least one of a wafer and a probe card) to the transfer object housing or each of the measurement units. Furthermore, the present invention can provide a prober and a transfer unit, the prober being provided with a casing that houses transfer objects and includes an opening through which the transfer objects go in and out, and the transfer unit that moves to a delivery destination of the transfer object to deliver the transfer objects to/from the delivery destination of the transfer objects through the opening, the prober and the transfer unit can cause the casing that houses the transfer objects to be in a sealed state, eliminate the necessity for a physical door and a mechanism for open/close the door and speedily deliver the transfer objects.

DETAILED DESCRIPTION OF THE EMBODIMENTS

Hereinafter, preferred embodiments of the present invention will be described according to the accompanying drawings.

Figure 1:
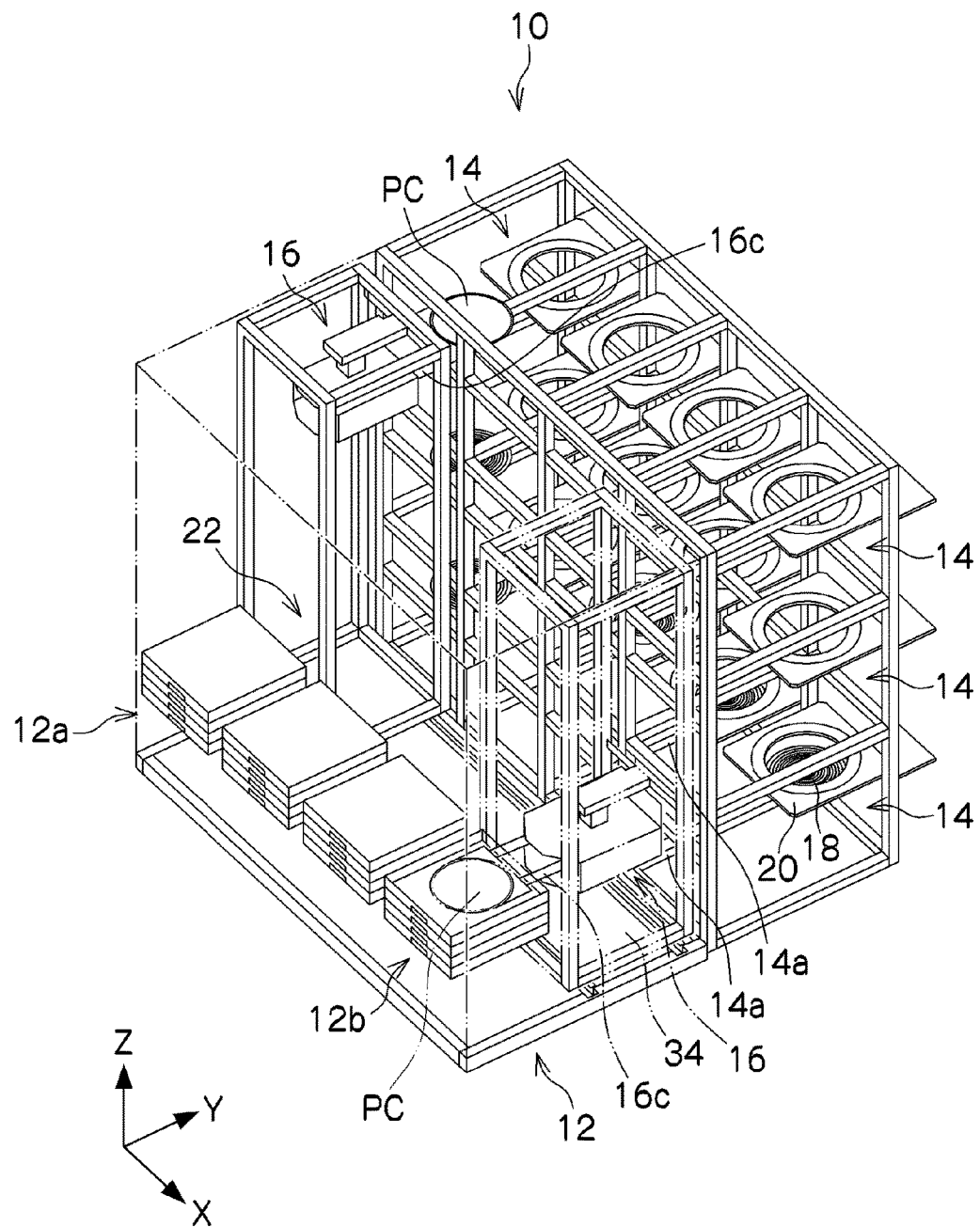
FIG. 1 is a perspective view illustrating a schematic configuration of a prober according to an embodiment.

FIG. 1 is a perspective view illustrating a schematic configuration of a prober 10 according to the present embodiment.

As shown in FIG. 1, the prober 10 of the present embodiment is provided with a transfer object housing 12, a plurality of measurement units 14, a transfer unit 16 that moves between the transfer object housing 12 and each of the measurement units 14 to transfer transfer objects (at least one of a wafer and a probe card in the present embodiment) into the transfer object housing 12 or each of the measurement units 14, and a moving device (transfer unit moving device) 22 that moves the transfer unit 16 between the transfer object housing 12 and each of the measurement units 14.

The transfer object housing 12 and each of the measurement units 14 are arranged such that sides accessed by the transfer unit 16 are opposed to each other (that is, facing each other) at a certain interval in the Y direction.

The transfer unit 16 is placed between the transfer object housing 12 and each of the measurement units 14.

The transfer object housing 12 includes: a wafer housing unit 12a that houses a plurality of wafers; and a probe card housing unit 12b that houses a plurality of probe cards. The number of transfer object housings 12 and an arrangement form the transfer object housings 12 are not particularly limited to this embodiment. In the present embodiment, four transfer object housings 12 each including the wafer housing unit 12a and the probe card housing unit 12b are arranged in a horizontal direction (X-axis direction) in a manner that sides accessed by the transfer unit 16 (right-side surfaces in FIG. 1) face toward the same direction. Note that the opposite side (left side in FIG. 1) of the sides accessed by the transfer unit 16 is accessed by an operator to collect the wafer or probe card, or the like.

Figure 7A:
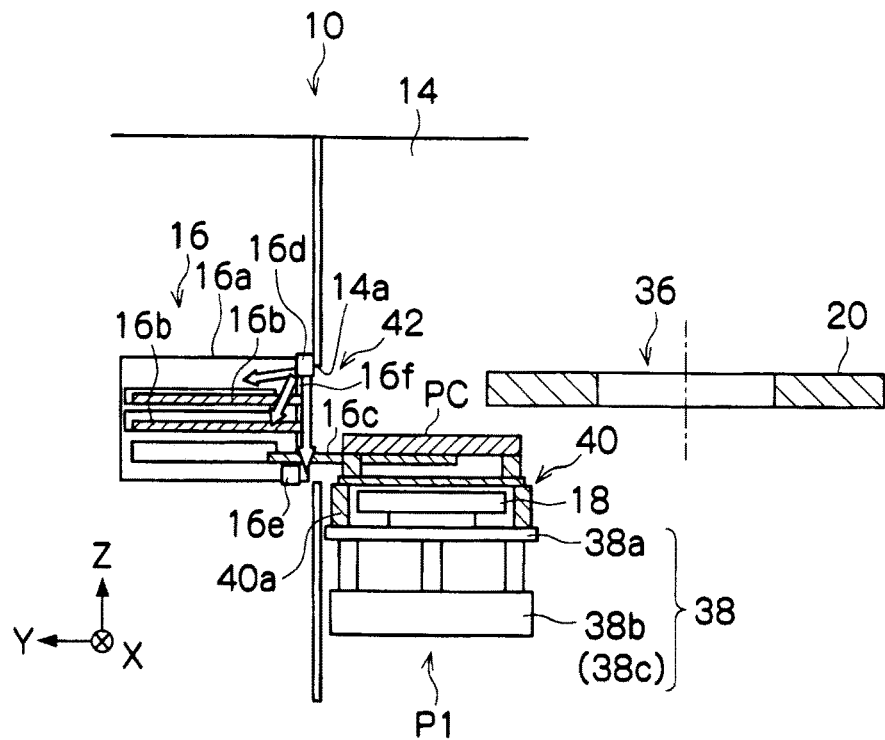
FIG. 7A is a longitudinal cross-sectional view illustrating a schematic configuration of the transfer unit and the measurement unit.
Figure 7B:
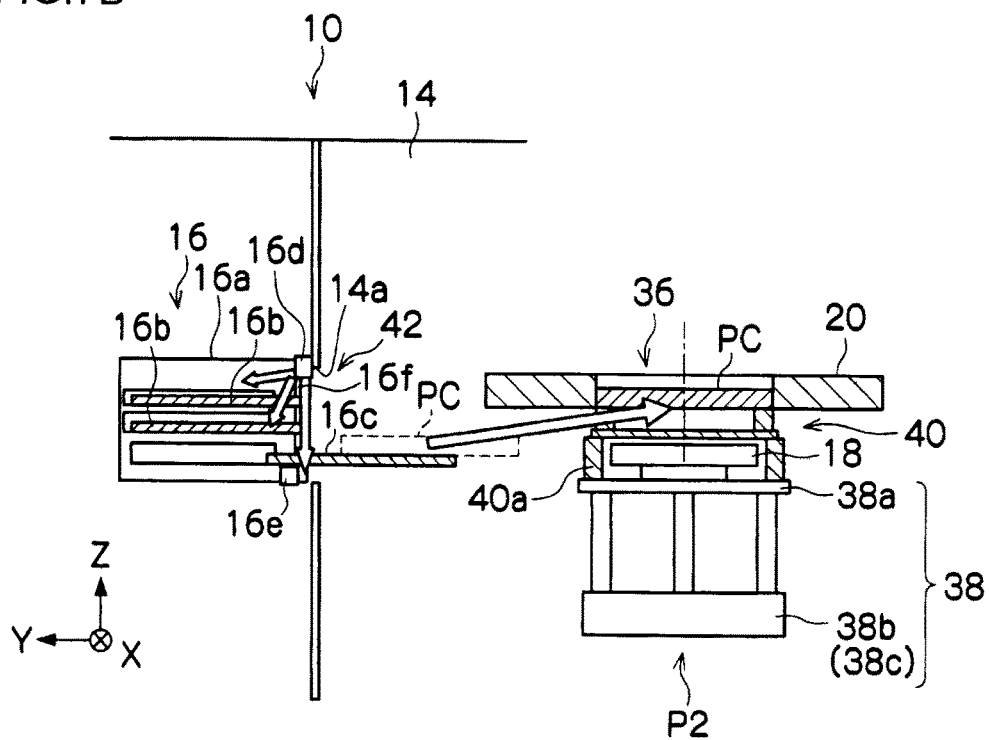
FIG. 7B is a longitudinal cross-sectional view illustrating a schematic configuration of the transfer unit and the measurement unit.

As shown in FIG. 1, the plurality of measurement units 14 constitute a rectangular parallelepiped measuring chamber (also referred to as a "prober chamber") formed by combining a plurality of frames extending in the X-axis direction, a plurality of frames extending in the Y-axis direction and a plurality of frames extending in the Z-axis direction. As shown in FIG. 7A and FIG. 7B, a wafer chuck 18 that holds a wafer, a head stage 20, a test head (not shown) placed on the head stage 20 and a first probe card holding mechanism 36 that holds a probe card PC are arranged inside each of the plurality of measurement units 14.

Figure 2:
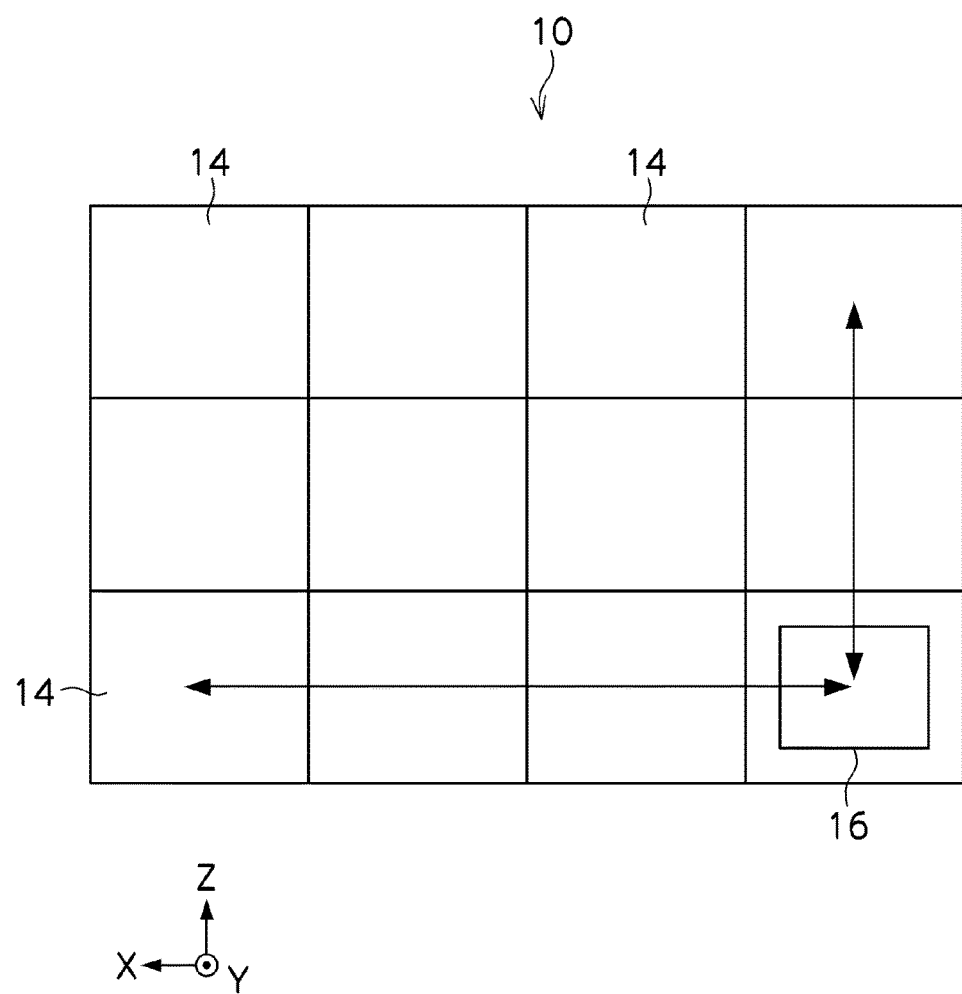
FIG. 2 is a front view of each measurement unit.

FIG. 2 is a front view of each of the measurement units 14.

Although the number of measurement units 14 and an arrangement form thereof are not particularly limited, in the present embodiment, as shown in FIG. 1 and FIG. 2, the measurement units 14 are two-dimensionally arranged such that three groups of measurement units made up of four measurement units 14 are arranged in the horizontal direction (X-axis direction) and the three groups of the measurement units are piled in the vertical direction (Z-axis direction) with sides (surfaces on the left side in FIG. 1) accessed by the transfer unit 16 facing the same direction.

An opening 14a through which a wafer holding arm (wafer arm: transfer object holding arm) 16b and a probe card holding arm (probe card arm) 16c of the transfer unit 16 go in and out is formed in each of the measurement units 14 (surface on the side accessed by the transfer unit 16). Surfaces other than the surface in which the opening 14a is formed may be closed or provided with an opening in each of the measurement units 14.

The wafer chuck 18 is adjusted to a target temperature (inspection temperature) of a high temperature or low temperature by a known temperature adjustment apparatus (e.g., heat plate or chiller apparatus built in the wafer chuck 18).

The environment in each of the measurement units 14 is controlled as follows. For example, the temperature in each of the measurement units 14 is controlled to a target temperature (inspection temperature) according to a temperature of the wafer chuck 18 disposed in each of the measurement units 14. Furthermore, the humidity in each of the measurement units 14 is controlled to a target humidity by a known mechanism which purges air in each of the measurement units 14 with dry air. The environment in each of the measurement units 14 is controlled by a known mechanism purging a predetermined gas (e.g., nitrogen gas) into each of the measurement units 14. Each of the measurement units 14 conducts a plurality of types of inspection such as a high temperature inspection, low temperature inspection or inspection under a predetermined gas (e.g., nitrogen gas) atmosphere which will be described later. The environment in each of the measurement units 14 is controlled so as to become an environment appropriate for an inspection to be conducted by each of the measurement units 14. Note that the inspection conducted by each of the measurement units 14 may be the same or be different among the respective measurement units.

The first probe card holding mechanism 36 is means for detachably holding a probe card PC and is provided above the wafer chuck 18, for example, on the head stage 20 side. The first probe card holding mechanism 36 detachably holds the probe card PC transferred to the first probe card holding mechanism 36 through a probe card transfer mechanism which will be described later. Since the first probe card holding mechanism 36 is known (e.g., see Japanese Patent Application Laid-Open No. 2000-150596), further description is omitted.

An alignment apparatus 38 that performs a relative alignment between the probe card PC held by the first probe card holding mechanism 36 and the wafer held by the wafer chuck 18 and a moving device (not shown) that moves the alignment apparatus 38 mutually among the four measurement units 14 are arranged in each measurement unit group. The alignment apparatus 38 is mutually moved among the four measurement units 14 included in the measurement unit group in which the alignment apparatus 38 is disposed and shared among the four measurement units 14. Regarding the moving device that moves the alignment apparatus 38 mutually among the four measurement units 14, an apparatus described in Japanese Patent Application Laid-Open No. 2014-150168 can be applied.

The alignment apparatus 38 is means for performing a relative alignment between the probe card PC held by the first probe card holding mechanism 36 and the wafer held by the wafer chuck 18. The alignment apparatus 38 includes moving and rotation mechanisms that move the wafer chuck 18 in X-Y-Z-θ directions such as a Z-axis movable unit 38a that ascends/descends (elevates up and down) in the Z-axis direction, a Z-axis fixing unit 38b and an XY movable unit 38c. The alignment apparatus 38 is mainly used to align the wafer W held by the wafer chuck 18 with respect to the probe of the probe card PC held above the wafer chuck 18 using a known method, bringing the wafer W into electrically contact with the probe and conduct an electrical characteristic inspection of the wafer W via the test head, while moving in the X-Y-Z-θ directions.

While holding the wafer chuck 18 in the measurement unit 14, the alignment apparatus 38 moves between a probe card receiving position P1 in the vicinity of the opening 14a (see FIG. 7A) and a preheating position P2 below the first probe card holding mechanism 36 (see FIG. 7B). This movement is implemented by a known alignment apparatus moving device (not shown).

When receiving the probe card PC, the alignment apparatus moving device moves the alignment apparatus 38 which is holding the wafer chuck 18 heated to a target temperature to the probe card receiving position P1, and when transferring the probe card PC to the first probe card holding mechanism 36, the alignment apparatus moving device moves the alignment apparatus 38 which is holding the probe card PC and the wafer chuck 18 heated to a target temperature to the preheating position P2.

The alignment apparatus 38 is provided with a second probe card holding mechanism 40 (also referred to as a "card lifter").

The second probe card holding mechanism 40 is means for receiving the probe card PC from the probe card holding arm 16c and holding the probe card PC. The second probe card holding mechanism 40 includes a holding unit 40a (e.g., a ring-shaped member or a plurality of pins) attached to the Z-axis movable unit 38a in a manner that surrounds the wafer chuck 18, and an elevating mechanism (not shown) that elevates/lowers (elevates up and down) the holding unit 40a in the Z-axis direction with respect to the Z-axis movable unit 38a.

When receiving and holding the probe card PC, the holding unit 40a is elevated in the Z-axis direction with respect to the Z-axis movable unit 38a in a state where the alignment apparatus 38 is moved to the probe card receiving position P1 so as to bring the holding unit 40a into contact with the probe card PC (outer circumferential edge of a undersurface), and then, the probe card PC is lifted from the probe card holding arm 16c by the holding unit 40a which is elevated in the Z-axis direction. The probe card PC is held directly above the wafer chuck 18.

The probe card transfer mechanism is means for transferring the probe card PC held by the second probe card holding mechanism 40 to the first probe card holding mechanism 36. The probe card transfer mechanism includes, for example, the Z-axis movable unit 38a movable up and down in the Z-axis direction, provided in the alignment apparatus 38.

The transfer of the probe card PC to the first probe card holding mechanism 36 is performed by elevating the Z-axis movable unit 38a in the Z-axis direction in a state where the alignment apparatus 38 has been moved to the preheating position P2.

Figure 3A:
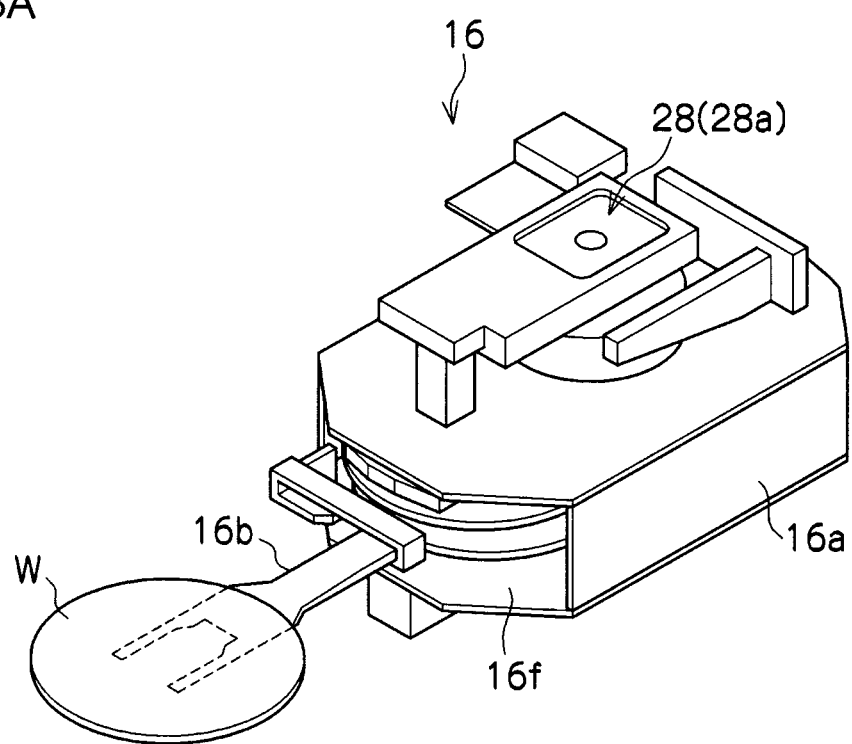
FIG. 3A is a perspective view of a transfer unit.
Figure 3B:
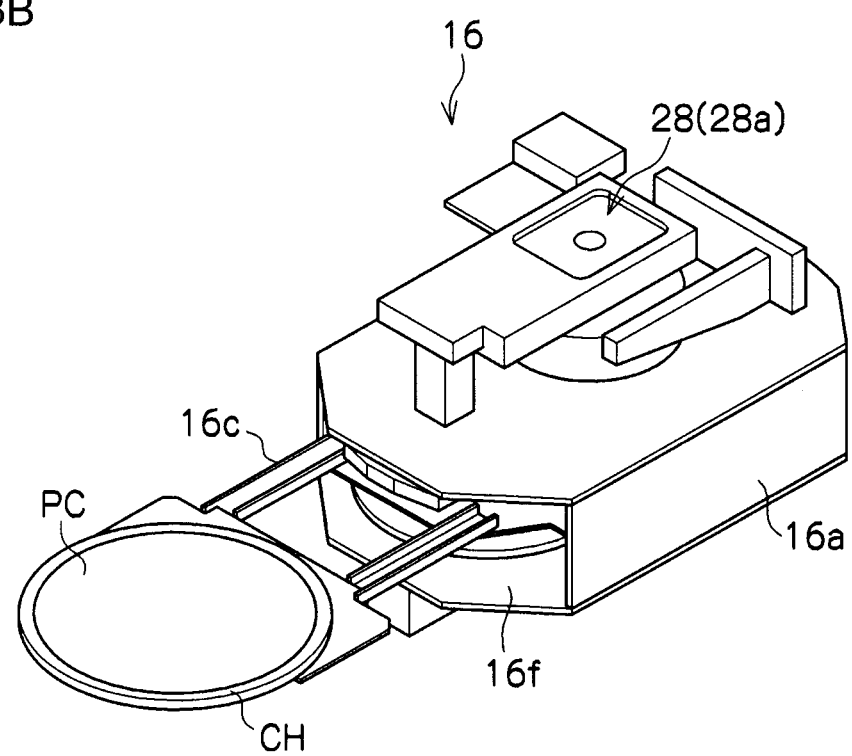
FIG. 3B is a perspective view of the transfer unit.
Figure 4:
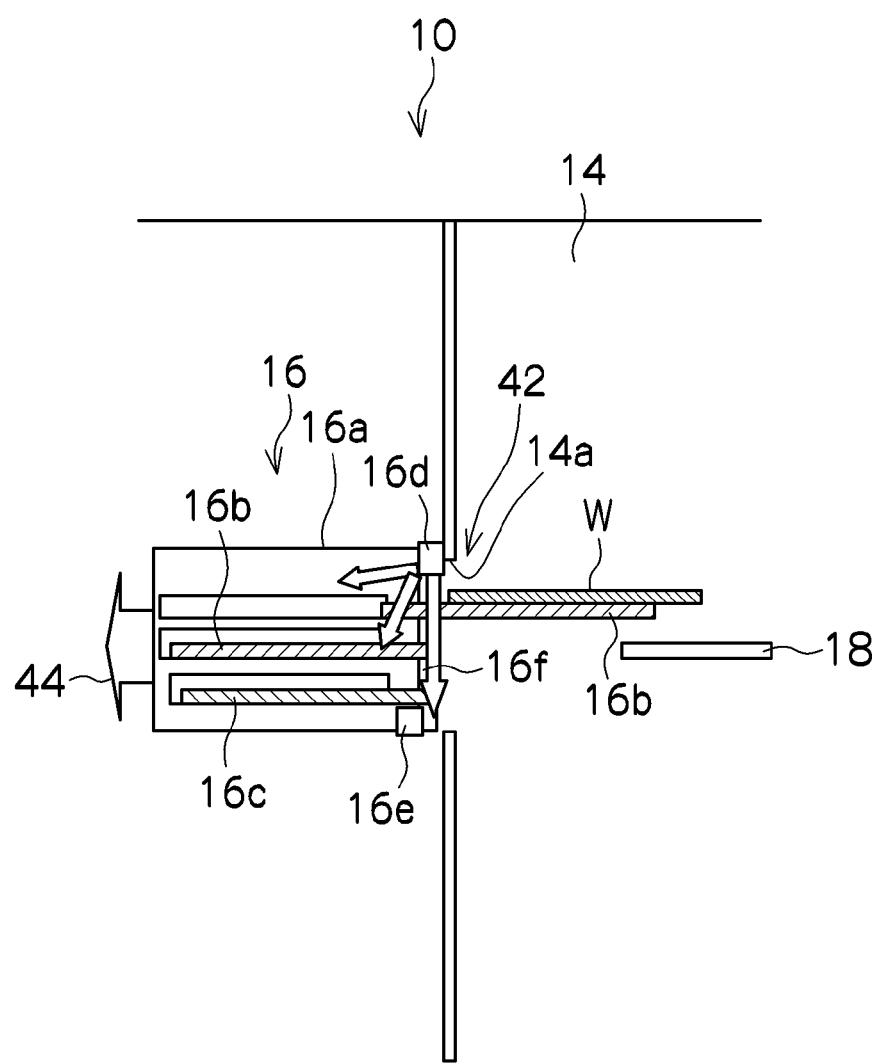
FIG. 4 is a longitudinal cross-sectional view illustrating a schematic configuration of the transfer unit.

FIG. 3A and FIG. 3B are perspective views of the transfer unit 16 and FIG. 4 is a longitudinal cross-sectional view illustrating a schematic configuration of the transfer unit 16.

The transfer unit 16 is means which moves between the transfer object housing 12 and each of the measurement units 14 in the X-axis direction and the Z-axis direction to transfer the wafer W or the probe card PC into the transfer object housing 12 or the interior of each of the measurement units 14. As shown in FIG. 3A, FIG. 3B and FIG. 4, the transfer unit 16 is provided with a casing 16a that houses the wafer W and the probe card PC. The casing 16a includes an opening 16f through which the wafer W and the probe card PC (wafer holding arm 16b and probe card holding arm 16c) go in and out. The casing 16a has a rectangular parallelepiped shape. The wafer holding arm 16b, the probe card holding arm 16c, an arm moving mechanism (not shown) that individually moves the respective arms 16b and 16c, environment controller 16d that controls an environment in the casing 16a and a sensor 16e that detects the environment in the casing 16a are arranged in the casing 16a. The number of transfer units 16 is not particularly limited. One transfer unit 16 is used in the present embodiment. Although FIG. 1 shows two transfer units 16, it is to express that one transfer unit 16 accesses the transfer object housing 12 (probe card housing unit 12b) (see the transfer unit 16 described at the right bottom in FIG. 1) and accesses the measurement unit 14 (see the transfer unit 16 described at the left top in FIG. 1).

The wafer holding arm 16b is means for holding the wafer W. The wafer holding arm 16b is disposed in the casing 16a so as to be movable in the horizontal direction along, for example, a guide rail (not shown) provided in the casing 16a. The wafer holding arm 16b is housed in the casing 16a together with the wafer W in a state where the wafer holding arm 16b holds the wafer W.

The probe card holding arm 16c is means for holding the probe card PC. The probe card holding arm 16c is disposed in the casing 16a so as to be movable in the horizontal direction along, for example, a guide rail (not shown) provided in the casing 16a. The probe card holding arm 16c is housed in the casing 16a together with the probe card PC in a state where the probe card holding arm 16c holds the probe card PC. The probe card PC includes a card holder CH. The probe card PC may include a seal ring instead of the card holder CH, in some cases.

The number of respective arms 16b and 16c and their arrangement forms are not particularly limited, and in the present embodiment, as shown in FIG. 4, two wafer holding arms 16b and one probe card holding arm 16c are arranged in three levels in the vertical direction.

The arm moving mechanism includes a known mechanism such as a drive motor (not shown) provided in the casing 16a. Rotating the drive motor in forward and reverse directions causes the respective arms 16b and 16c to individually reciprocate in the horizontal direction such that the arms 16b and 16c go in and out through the opening 16f formed in the casing 16a.

The transfer unit 16 is provided with air curtain formation means 42.

The air curtain formation means 42 is means for forming an air curtain that closes the opening 16f formed in the casing 16a and causing the casing 16a to be in a sealed or substantially sealed state. The air curtain formation means 42 is constituted by, for example, a known air injection port.

The number of air injection ports, shape and an arrangement form thereof are not particularly limited. In the present embodiment, as shown in FIG. 4, a plurality of air injection ports are arranged in the vicinity of the top end edge of the opening 16f along the top end edge (direction orthogonal to the surface of the paper in FIG. 4) in a posture to inject air downward from the plurality of air injection ports. Note that an arrow 44 in FIG. 4 indicates an example of a flow of dry air injected from the environment controller 16d.

The environment in the casing 16a is controlled as follows. For example, the temperature and humidity in the casing 16a are controlled to a target temperature and humidity under a predetermined gas atmosphere by purging with dry air (high temperature or low temperature dry air) or a predetermined gas (nitrogen gas) in each of the measurement units 14. This is achieved by known environment controller 16d, for example, a temperature adjustment gas supply source including a heater and cooler, an air blower (not shown) and a pipeline (not shown) connecting the air blower and the casing 16a. The environment controller 16d may include a dehumidifier. A gas (high temperature or low temperature dry air) whose temperature (and humidity) is adjusted by the temperature adjustment gas supply source is supplied into the casing 16a by the air blower via the pipeline and injected from the air injection port, to form an air curtain that closes the opening 16f formed in the casing 16a. This causes the casing 16a to be in a sealed or substantially sealed state. The supply source of the gas supplied into the casing 16a may be the same as or different from the supply source of the gas injected from the air injection port. Surfaces other than the surface in which the opening 16f of the casing 16a is formed may be closed or may be provided with an opening. The environment controller 16d may be attached to the casing 16a or may be attached to the arms 16b and 16c.

The sensor 16e is a sensor that detects an environment in the casing 16a. The sensor 16e is, for example, a temperature sensor or a humidity sensor. The sensor 16e may be included in the environment controller 16d.

The environment controller 16d controls the environment in the casing 16a so as to become an environment according to (appropriate for) the environment of the transfer destination of the transfer object. Specifically, the environment controller 16d controls the interior of the casing 16a to a target environment based on a detection result of the sensor 16e. For example, the environment controller 16d controls the temperature adjustment gas supply source based on the detection result of the sensor 16e so that the temperature and humidity in the casing 16a become a target temperature and humidity. The function of the environment controller 16d is achieved through feedback control by a controller (not shown) to which the sensor 16e and the temperature adjustment gas supply source (heater and cooler) are electrically connected. Note that the environment controller 16d and the air curtain formation means 42 may be integrated. That is, an air injection port may be provided facing downward so as to close the opening 16f and an air injection port for dry air to control the environment in the casing 16a may also be provided in one apparatus. Here, the air injection port for dry air to control the environment in the casing 16a may be preferably provided in a direction in which the injected dry air circulates well in the casing 16a. Integration of the environment controller 16d and the air curtain formation means 42 reduces the space for providing the environment controller 16d and the air curtain formation means 42 and makes it possible to effectively use the space of the casing 16a. Moreover, the integration of the environment controller 16d and the air curtain formation means 42 can make it possible to share the temperature adjustment gas supply source including the heater and cooler and the air blower or the like, between the environment controller 16d and the air curtain formation means 42.

Figure 5:
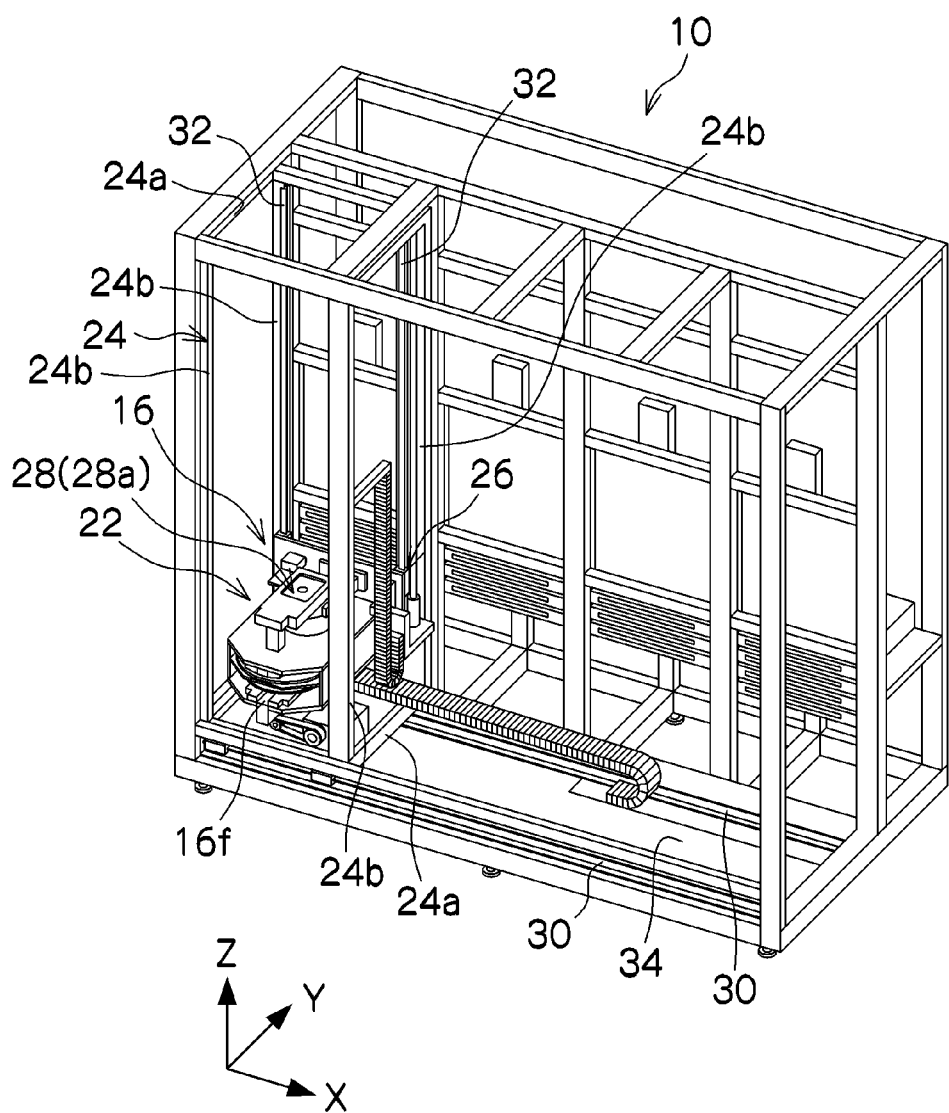
FIG. 5 is a perspective view of a moving device.
Figure 6:
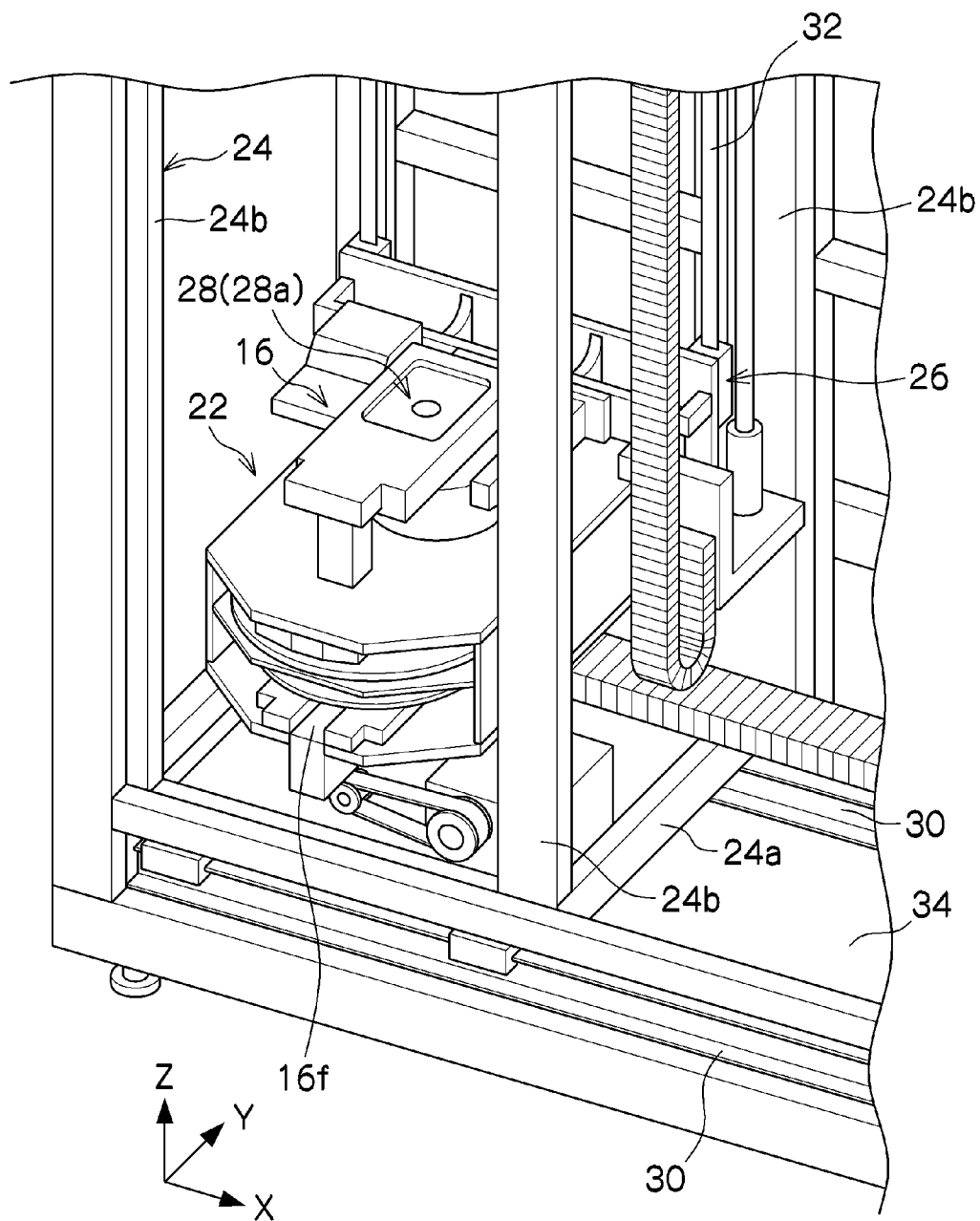
FIG. 6 is a partially enlarged perspective view of the moving device.

FIG. 5 is a perspective view of the moving device 22 and FIG. 6 is a partially enlarged perspective view of the moving device 22.

The moving device 22 is means for moving the transfer unit 16 between the transfer object housing 12 and each of the measurement units 14 in the X-axis direction and the Z-axis direction. As shown, for example, in FIG. 5 and FIG. 6, the moving device 22 includes: a first movable body 24 that moves between the transfer object housing 12 and each of the measurement units 14 in the horizontal direction (X-axis direction) in which each of the measurement units 14 is arranged; a first movable body moving mechanism (not shown) that moves the first movable body 24 in the horizontal direction (X-axis direction); a second movable body 26 attached to the first movable body 24 so as to be movable in the vertical direction (Z-axis direction) in which each of the measurement units 14 is arranged, and configured to support the transfer unit 16 so as to be rotatable around the vertical axis (Z-axis); a second movable body moving mechanism (not shown) that moves the second movable body 26 in the vertical direction (Z-axis direction); and a transfer unit rotation mechanism 28 attached to the second movable body 26 and configured to rotate the transfer unit 16 around the vertical axis (Z-axis).

The first movable body 24 is, for example, a frame body constructed by connecting four respective corners of an upper and lower pair of rectangular frames 24a by four frames 24b extending in the Z-axis direction. A lower part of the first movable body 24 is movably connected to two guide rails 30 which extend in the X-axis direction, and are arranged in parallel on a base 34 between the transfer object housing 12 and each of the measurement units 14.

The first movable body moving mechanism is constructed of a known moving mechanism, for example, a ball screw (not shown) connected to the first movable body 24, a drive motor (not shown) to rotate the ball screw, or the like. By rotating the drive motor forward and backward, the first movable body 24 (transfer unit 16) moves along the guide rail 30 in the X-axis direction. Of course, the first movable body moving mechanism is not limited to this. The first movable body moving mechanism may be a mechanism for causing the first movable body 24 to self-run. For example, the first movable body moving mechanism may include wheels provided in the first movable body 24 and a drive motor to rotate the wheels.

The second movable body 26 is movably connected to two guide rails 32 which extend in the Z-axis direction and are arranged parallel to the first movable body 24.

The second movable body moving mechanism is constructed of a known moving mechanism, for example, a ball screw (not shown) connected to the second movable body 26, a drive motor (not shown) to rotate the ball screw, or the like. By rotating the drive motor forward and backward, the second movable body 26 (transfer unit 16) moves along the guide rail 32 in the Z-axis direction. Of course, the second movable body moving mechanism is not limited to this. The second movable body moving mechanism may be a mechanism for causing the second movable body 26 to self-run. For example, the second movable body moving mechanism may include wheels provided in the second movable body 26 and a drive motor to rotate the wheels.

The transfer unit rotation mechanism 28 is constructed of a known rotation mechanism. For example, the transfer unit rotation mechanism 28 includes a rotation shaft (vertical shaft) provided in the second movable body 26, a drive motor 28a that rotates the rotation shaft, or the like. The top surface of the transfer unit 16 is fixed to the rotation shaft (vertical shaft). Rotating the drive motor 28a forward or backward causes the transfer unit 16 to rotate by 180° around the vertical axis (Z-axis) such that the opening 16f formed in the transfer unit 16 through which each arm 16b and 16c goes in and out faces the transfer object housing 12 or each of the measurement units 14.

Note that the respective apparatuses and mechanisms such as the alignment apparatus 38, the arm moving mechanism, the environment controller 16d, the moving device 22 (the first movable body moving mechanism, the second movable body moving mechanism, the transfer unit rotation mechanism 28) are driven under the control of control means (controller or the like) which is not shown.

Next, an operation example of the transfer unit 16 in the prober 10 of the present embodiment will be described.

Wafer Transfer Operation Example 1

First, below is an explanation about an operation example when the transfer unit 16 transfers the wafer W from the wafer housing unit 12a (e.g., room temperature of 23° C.) into the measurement unit 14 at which a high temperature inspection (e.g., inspection temperature of 80° C.) is conducted.

First, the transfer unit 16 is moved to a position where the transfer unit 16 can access the wafer housing unit 12a (position where the wafer W can be extracted), and the transfer unit 16 is rotated 180° such that the opening 16f formed in the transfer unit 16 through which each arm 16b or 16c goes in and out faces the wafer housing unit 12a.

Next, the wafer holding arm 16b is advanced into the wafer housing unit 12a to take one wafer W out from the wafer housing unit 12a and house the wafer W in the casing 16a. In addition, the environment in the casing 16a is controlled so as to become an environment according to the environment of the measurement unit 14 which is the transfer destination (here, high temperature inspection at 80° C. conducted in the measurement unit 14). Specifically, a gas whose temperature is adjusted by the temperature adjustment gas supply source (e.g., dry air or nitrogen, whose temperature is adjusted to 60° C.) is supplied into the casing 16a and ejected from the air injection port to form an air curtain that closes the opening 16f formed in the casing 16a. This causes the casing 16a to be in a sealed or substantially sealed state. Note that the target temperature adjusted by the temperature adjustment gas supply source is not limited to 60° C. The target temperature may be set to an appropriate temperature, considering a distance and time for transferring the wafer W from the wafer housing unit 12a to the measurement unit 14 which is the transfer destination, an inspection temperature at the measurement unit 14 which is the transfer destination, or the like.

Next, the transfer unit 16 is moved to a position where the transfer unit 16 can access the measurement unit 14 which is the transfer destination (position where the wafer W can be delivered), and the transfer unit 16 is rotated by 180° such that the opening 16f formed in the transfer unit 16 through which each arm 16b or 16c goes in and out faces the measurement unit 14 which is the transfer destination. In the meantime, the wafer W housed in the transfer unit 16 continues to be heated with the gas supplied into the casing 16a (sealed or substantially sealed space).

Next, the wafer holding arm 16b is advanced into the measurement unit 14 via the opening 16f on the transfer unit 16 side on which the air curtain is formed and the opening 14a on the measurement unit 14 side, and the wafer W is loaded on the wafer chuck 18. The wafer holding arm 16b passes through the opening 16f which is closed with the air curtain and advances into the measurement unit 14 while holding the wafer W. In that case, the wafer W is further heated by the air curtain.

In this way, closing the opening 16f not with a physical door or shutter as in the case of the prior arts but with the air curtain can exert the following effects.

First, as in the case where the opening 16f is closed with a physical door or shutter, it is possible to cause the casing 16a to be in a sealed or substantially sealed state, and by supplying gas whose temperature is adjusted into this sealed casing 16a, it is possible to cause the environment in the casing 16a to become an environment according to (appropriate to) the environment of the measurement unit 14 which is the transfer destination (here, high temperature inspection at 80° C. is conducted in the measurement unit 14).

Second, it is possible to the probe card holding arm 16c into the measurement unit 14 while keeping the interior of the casing 16a sealed.

Third, compared to the case where the opening 16f is closed with a physical door or shutter, the time for opening/closing the physical door or shutter is unnecessary, and so it is possible to advance the probe card holding arm 16c into the measurement unit 14 speedily.

Fourth, when the probe card PC is delivered, the probe card PC can be heated by the air curtain blown over the probe card PC.

Fifth, when the opening 16f is closed with the physical door or shutter, the gas supplied into the casing 16a touches the physical door or shutter, and heat of the gas is dissipated to an external environment via the physical door or shutter. This lowers the temperature of the gas supplied into the casing 16a. In contrast, when the opening 16f is closed with the air curtain as in the present embodiment, the gas supplied into the casing 16a touches the air curtain at the same temperature as that of the casing 16a. Therefore, it is possible to prevent the temperature of the gas supplied into the casing 16a from lowering.

The loaded wafer W is held by the wafer chuck 18 through vacuum suction. The wafer W is heated by the wafer chuck 18 and is in a standby state until the temperature of the wafer W reaches the inspection temperature (here, 80° C.). When the temperature of the wafer W reaches the inspection temperature, while moving in the X-Y-Z-θ direction, the alignment apparatus 38 aligns the wafer W held by the wafer chuck 18 with respect to the probe of the probe card PC held above the wafer chuck 18 using a known method. Then, the wafer chuck 18 moves in the Z-axis direction by an action of the alignment apparatus 38, and the wafer W is brought into electrically contact with the probe, thus conducting an electrical characteristic inspection of the wafer W through a test head.

Thus, the environment in the transfer unit 16 (heating the wafer) is controlled using the time until the wafer is transferred from the wafer housing unit 12a into the measurement unit 14 which is the transfer destination to reduce the difference from the inspection temperature at the measurement unit 14 which is the transfer destination. Therefore, it is possible to reduce (or eliminate) the standby time for bringing the temperature of the wafer closer to the inspection temperature in the measurement unit 14 which is the transfer destination, compared to the prior arts. This makes it possible to improve throughput at the measurement unit 14.

Wafer Transfer Operation Example 2

Next, below is an explanation about an operation example when the transfer unit 16 transfers the wafer W which is brought into a high temperature state (e.g., 80° C.) due to a high temperature inspection, from the measurement unit 14 into the wafer housing unit 12a (e.g., room temperature of 23° C.).

First, the wafer holding arm 16b takes the wafer W immediately after the completion of the high temperature inspection out from the measurement unit 14 and houses the wafer W in the casing 16a. This is performed using the reverse procedure of the above-described wafer transfer operation example 1. In addition, the environment in the casing 16a is controlled so as to become an environment according to the environment (here, room temperature of 23° C.) of the wafer housing unit 12a which is the transfer destination. Specifically, the gas whose temperature is adjusted by the temperature adjustment gas supply source (e.g., dry air or nitrogen whose temperature is adjusted to 40° C.) is supplied into the casing 16a and injected from the air injection port to form an air curtain that closes the opening 16f formed in the casing 16a. This causes the casing 16a to be in a sealed or substantially sealed state. Note that the target temperature adjusted by the temperature adjustment gas supply source is not limited to 40° C. The target temperature may be set to an appropriate temperature, considering a distance and time in which the wafer W is transferred from the measurement unit 14 to the wafer housing unit 12a which is the transfer destination, a temperature at the wafer housing unit 12a which is the transfer destination, or the like. The wafer W immediately after the completion of the high temperature inspection is taken out from the measurement unit 14 through the opening 16f closed with the air curtain in a state where the wafer W is held by the wafer holding arm 16b, and then, housed in the casing 16a. In that case, the wafer W is cooled by the air curtain blown over the wafer W and is further cooled with the gas supplied into the casing 16a.

Next, the transfer unit 16 is moved to a position where the transfer unit 16 can access the wafer housing unit 12a which is the transfer destination (position where the wafer W can be delivered), and the transfer unit 16 is rotated by 180° such that the opening 16f formed in the transfer unit 16 through which each arm 16b or 16c goes in and out faces the wafer housing unit 12a which is the transfer destination. In the meantime, the wafer W housed in the transfer unit 16 continues to be cooled with the gas supplied into the casing 16a (sealed or substantially sealed space).

In this way, closing the opening 16f not with a physical door or shutter as in the case of the prior arts but with the air curtain can exert effects similar to those in the above-described wafer transfer operation example 1.

Next, the wafer holding arm 16b is advanced into the wafer housing unit 12a and the wafer W is returned into the wafer housing unit 12a.

Thus, the environment in the transfer unit 16 (cooling the wafer) is controlled using the time until the wafer is transferred from the measurement unit 14 into the wafer housing unit 12a which is the transfer destination to reduce the difference from the temperature at the wafer housing unit 12a which is the transfer destination. Therefore, it is possible to eliminate (or reduce) the standby time for bringing the temperature of the wafer closer to the normal temperature in the measurement unit 14, compared to the prior arts, and the wafer immediately after the completion of the high temperature inspection can be taken out from the measurement unit 14 and returned to the wafer housing unit 12a. This makes it possible to improve throughput at the measurement unit 14. It is also possible to eliminate (or reduce) the waiting time until the operator collects the wafer after housing the wafer.

Wafer Transfer Operation Example 3

Next, below is an explanation about an operation example when the transfer unit 16 transfers the wafer W from the wafer housing unit 12a (e.g., room temperature of 23° C.) into the measurement unit 14 at which a low temperature inspection (e.g., inspection temperature of −10° C.) is conducted.

First, the transfer unit 16 is moved to a position where the transfer unit 16 can access the wafer housing unit 12a (position where the wafer W can be extracted), the transfer unit 16 is rotated by 180° such that the opening 16f formed in the transfer unit 16 through which each arm 16b or 16c goes in and out faces the wafer housing unit 12a.

Next, the wafer holding arm 16b is advanced into the wafer housing unit 12a, and one wafer W is taken out from the wafer housing unit 12a and housed in the casing 16a. In addition, the environment in the casing 16a is controlled so as to become an environment according to the environment (here, low temperature inspection at −10° C. is conducted in the measurement unit 14) of the measurement unit 14 which is the transfer destination. Specifically, a gas whose temperature or humidity is adjusted by the temperature adjustment gas supply source (e.g., dry air or nitrogen whose temperature is adjusted to −15° C.) is supplied into the casing 16a and injected from the air injection port, thus forming an air curtain that closes the opening 16f formed in the casing 16a. This causes the casing 16a to be in a sealed or substantially sealed state. Note that the target temperature adjusted by the temperature adjustment gas supply source is not limited to −15° C. The target temperature may be set to an appropriate temperature, considering a distance and time for transferring the wafer W from the wafer housing unit 12a to the measurement unit 14 which is the transfer destination, an inspection temperature at the measurement unit 14 which is the transfer destination, or the like.

Next, the transfer unit 16 is moved to a position where the transfer unit 16 can access the measurement unit 14 which is the transfer destination (position where the wafer W can be delivered), and the transfer unit 16 is rotated by 180° such that the opening 16f formed in the transfer unit 16 through which each arm 16b or 16c goes in and out faces the measurement unit 14 which is the transfer destination. In the meantime, the wafer W housed in the transfer unit 16 continues to be temperature adjusted (for example, cooled)

and dried by the gas supplied into the casing 16a (sealed or substantially sealed space). It is thereby possible to prevent condensation from occurring on the wafer W while the wafer W is being transferred to the measurement unit 14 which is the transfer destination.

Next, the wafer holding arm 16b is advanced into the measurement unit 14 through the opening 16f on the transfer unit 16 side on which the air curtain is formed and the opening 14a on the measurement unit 14 side, and the wafer W is loaded on the wafer chuck 18. The wafer holding arm 16b passes through the opening 16f which is closed with the air curtain and advances into the measurement unit 14 while holding the wafer W. In that case, the wafer W is further cooled and dried by the air curtain. This makes it possible to prevent condensation from occurring on the wafer W when the wafer W is delivered.

Thus, closing the opening 16f not with a physical door or shutter as in the case of the prior arts but with the air curtain can exert effects similar to those in the above-described wafer transfer operation example 1.

The loaded wafer W is held by the wafer chuck 18 through vacuum suction. It is waited until the wafer W is cooled by the wafer chuck 18 and the temperature of the wafer W reaches an inspection temperature (here, −10° C.). When the temperature of the wafer W reaches the inspection temperature, the alignment apparatus 38 aligns the wafer W held by the wafer chuck 18 with respect to the probe of the probe card PC held above the wafer chuck 18 using a known method while moving in the X-Y-Z-θ directions. Then, the wafer chuck 18 moves in the Z-axis direction by an action of the alignment apparatus 38, and the wafer W is brought into electrical contact with the probe, thus conducting an electrical characteristic inspection of the wafer W through a test head. Note that a gas having a dew point which would not produce condensation at the cooling temperature of the wafer or probe card (e.g., dry air at 20° C.) is supplied into the measurement unit 14 which is the transfer destination, using known means so that no condensation occurs in the wafer or probe card during the low temperature inspection, and the low temperature inspection is conducted in an environment in which this gas is supplied.

Thus, the environment in the transfer unit 16 (cooling the wafer) is controlled using the time during the wafer is transferred from the wafer housing unit 12a into the measurement unit 14 which is the transfer destination to reduce the difference from the inspection temperature at the measurement unit 14 which is the transfer destination. Therefore, it is possible to reduce (or eliminate) the standby time for bringing the temperature of the wafer closer to the inspection temperature in the measurement unit 14 which is the transfer destination, compared to the prior arts. This makes it possible to improve throughput at the measurement unit 14.

Wafer Transfer Operation Example 4

Next, below is an explanation about an operation example when the transfer unit 16 transfers the wafer W which is brought into a low temperature state (e.g., −40° C.) by a low temperature inspection from the measurement unit 14 into the wafer housing unit 12a (e.g., room temperature of 23° C.).

First, the wafer holding arm 16b takes the wafer W immediately after the completion of the low temperature inspection out from the measurement unit 14 and houses the wafer W in the casing 16a. This is performed using the reverse procedure of that in the above-described wafer transfer operation example 3. In addition, the environment in the casing 16a is controlled so as to become an environment according to the environment (here, room temperature of 23° C.) of the wafer housing unit 12a which is the transfer destination. Specifically, a gas whose temperature or humidity is adjusted by the temperature adjustment gas supply source (e.g., dry air or nitrogen whose temperature is adjusted to 15° C.) is supplied into the casing 16a and injected from the air injection port to form an air curtain that closes the opening 16f formed in the casing 16a. This causes the casing 16a to be in a sealed or substantially sealed state. Note that the target temperature adjusted by the temperature adjustment gas supply source is not limited to 15° C. The target temperature may be set to an appropriate temperature, considering a distance and time for transferring the wafer W from the measurement unit 14 to the wafer housing unit 12a which is the transfer destination, a temperature at the wafer housing unit 12a which is the transfer destination, or the like. The wafer W immediately after the completion of the low temperature inspection is taken out from the measurement unit 14 through the opening 16f closed with the air curtain in a state where the wafer is held by the wafer holding arm 16b, and the wafer W is housed in the casing 16a. In that case, the wafer W is heated by the air curtain blown over the wafer W and is further heated with the gas supplied into the casing 16a. This makes it possible to prevent condensation from occurring on the wafer W when the wafer W is delivered.

Next, the transfer unit 16 is moved to a position where the transfer unit 16 can access the wafer housing unit 12a which is the transfer destination (position where the wafer W can be delivered), and the transfer unit 16 is rotated by 180° such that the opening 16f formed in the transfer unit 16 through which each arm 16b or 16c goes in and out faces the wafer housing unit 12a which is the transfer destination. In the meantime, the wafer W housed in the transfer unit 16 continues to be heated with the gas supplied into the casing 16a (sealed or substantially sealed space). It is thereby possible to prevent condensation from occurring on the wafer W while the wafer W is being transferred to the wafer housing unit 12a.

Thus, closing the opening 16f not with a physical door or shutter as in the case of the prior arts but with the air curtain can exert effects similar to those in the above-described wafer transfer operation example 1.

Next, the wafer holding arm 16b is advanced into the wafer housing unit 12a and the wafer W is returned into the wafer housing unit 12a.

Thus, the environment in the transfer unit 16 (heating the wafer) is controlled using the time until the wafer is transferred from the measurement unit 14 into the wafer housing unit 12a which is the transfer destination to reduce the difference from the temperature at the wafer housing unit 12a which is the transfer destination. Therefore, it is possible to eliminate (or reduce) the standby time for bringing the temperature of the wafer closer to the normal temperature in the measurement unit 14, compared to the prior arts, and the wafer immediately after the completion of the low temperature inspection can be taken out from the measurement unit 14 and return the wafer to the wafer housing unit 12a. This makes it possible to improve throughput at the measurement unit 14. Furthermore, it is possible to adjust the temperature environment so as to prevent the occurrence of condensation in the wafer until the wafer is transferred into the wafer housing unit 12a.

Wafer Transfer Operation Example 5

Next, below is an explanation about an operation example when the transfer unit 16 transfers the wafer W from the wafer housing unit 12a (e.g., room temperature of 23° C.) into the measurement unit 14 at which an inspection is conducted under a predetermined gas (e.g., nitrogen gas) atmosphere.

Next, the transfer unit 16 is moved to a position where the transfer unit 16 can access the wafer housing unit 12a (position where the wafer W can be taken), and the transfer unit 16 is rotated by 180° such that the opening 16f formed in the transfer unit 16 through which each arm 16b or 16c goes in and out faces the wafer housing unit 12a.

Next, the wafer holding arm 16b is advanced into the wafer housing unit 12a, and one wafer W is taken out from the wafer housing unit 12a and housed in the casing 16a. In addition, the environment in the casing 16a is controlled so as to become an environment according to the environment of the measurement unit 14 which is the transfer destination (here, inspection under a predetermined gas (e.g., a nitrogen gas) atmosphere). Specifically, wiring exposed on the wafer surface (particularly, copper wiring) and a gas (e.g., nitrogen gas) for oxidation prevention of the probe of the probe card are supplied into the casing 16a and injected from the air injection port to form an air curtain that closes the opening 16f formed in the casing 16a. This causes the casing 16a to be in a sealed or substantially sealed state.

Next, the transfer unit 16 is moved to a position where the transfer unit 16 can access the measurement unit 14 which is the transfer destination (position where the wafer W can be delivered), and the transfer unit 16 is rotated by 180° such that the opening 16f formed in the transfer unit 16 through which each arm 16b or 16c goes in and out faces the measurement unit 14 which is the transfer destination. In the meantime, the oxidation prevention gas continues to be supplied into the transfer unit 16 (sealed or substantially sealed space). This can prevent the wafer W from being oxidized while being transferred to the measurement unit 14 which is the transfer destination. Note that the oxidation prevention gas is also supplied into the measurement unit 14 which is the transfer destination using known means.

Next, the wafer holding arm 16b is advanced into the measurement unit 14 through the opening 16f on the transfer unit 16 side where the air curtain is formed and the opening 14a on the measurement unit 14 side, and the wafer W is loaded on the wafer chuck 18. The wafer holding arm 16b passes through the opening 16f closed with the air curtain and advances into the measurement unit 14 while holding the wafer W. In that case, due to the action of the air curtain, oxidization of the wafer W can be prevented.

Thus, closing the opening 16f not with a physical door or shutter as in the case of the prior arts but with the air curtain can exert effects similar to those in the above-described wafer transfer operation example 1.

The loaded wafer W is held by the wafer chuck 18 through vacuum suction. While moving in the X-Y-Z-θ directions, the alignment apparatus 38 aligns the wafer W held by the wafer chuck 18 with respect to the probe of the probe card PC held above the wafer chuck 18 using a known method. Then, the wafer chuck 18 moves in the Z-axis direction by an action of the alignment apparatus 38 and the wafer W is brought into electrical contact with the probe, thus conducting an electrical characteristic inspection of the wafer W through a test head. Note that the inspection is conducted under an environment in which an oxidation prevention gas is supplied.

Thus, while the wafer is being transferred from the wafer housing unit 12a into the measurement unit 14 which is the transfer destination, since the wafer is still left in an environment similar to that of the measurement unit 14 at which an inspection is conducted under a predetermined gas (e.g., nitrogen gas) atmosphere, it is possible to prevent the wiring (especially copper wiring) exposed on the wafer surface from being oxidized during transfer and delivery.

Note that the present operation example 5 can also be performed in combination with the above-described wafer transfer operation examples 1 to 4.

Probe Card Transfer Operation Example 1

Next, below is an explanation about an operation example when the transfer unit 16 transfers the probe card PC from the probe card housing unit 12b (for example, room temperature of 23° C.) into the measurement unit 14 at which a high temperature inspection (for example, inspection temperature of 80° C.) is conducted.

First, the transfer unit 16 is moved to a position where the transfer unit 16 can access the wafer housing unit 12a (position where the probe card PC can be taken out), and the transfer unit 16 is rotated by 180° such that the opening 16f formed in the transfer unit 16 through which each arm 16b or 16c goes in and out faces the probe card housing unit 12b.

Next, the probe card holding arm 16c is advanced into the probe card housing unit 12b to take one probe card PC out from the probe card housing unit 12b and house the probe card PC in the casing 16a. In addition, the environment in the casing 16a is controlled so as to become an environment according to the environment of the measurement unit 14 which is the transfer destination (here, an 80° C. high temperature inspection conducted in the measurement unit 14). Specifically, a gas whose temperature is adjusted by the temperature adjustment gas supply source (e.g., dry air or nitrogen whose temperature is adjusted to 60° C.) is supplied into the casing 16a and injected from the air injection port to form an air curtain that closes the opening 16f formed in the casing 16a. This causes the casing 16a to be in a sealed or substantially sealed state. Note that the target temperature adjusted by the temperature adjustment gas supply source is not limited to 60° C. The target temperature may be an appropriate temperature, considering a distance and time for transferring the probe card PC from the probe card housing unit 12b to the measurement unit 14 which is the transfer destination, an inspection temperature at the measurement unit 14 which is the transfer destination, or the like.

Next, the transfer unit 16 is moved to a position where the transfer unit 16 can access the measurement unit 14 which is the transfer destination (position where the probe card PC can be delivered), and the transfer unit 16 is rotated by 180° such that the opening 16f formed in the transfer unit 16 through which each arm 16b or 16c goes in and out faces the measurement unit 14 which is the transfer destination. In the meantime, the probe card PC housed in the transfer unit 16 continues to be heated with the gas supplied into the casing 16a (sealed or substantially sealed space).

Next, the probe card holding arm 16c is advanced into the measurement unit 14 through the opening 16f on the transfer unit 16 side in which the air curtain is formed and the opening 14a on the measurement unit 14 side (see FIG. 7A). The probe card holding arm 16c passes through the opening 16f which is closed with the air curtain and advances into the measurement unit 14 while holding the probe card PC. In that case, the probe card PC is further heated by the air curtain blown over it.

In this way, closing the opening 16f not with a physical door or shutter as in the case of the prior arts but with the air curtain can exert the effects similar to those in the above-described wafer transfer operation example 1.

Next, the holding unit 40*a* of the second probe card holding mechanism 40 receives the probe card PC from the probe card holding arm 16*c* and holds the probe card PC. Specifically, the alignment apparatus 38 which is holding the wafer chuck 18 heated to a target temperature (here, inspection temperature of 80° C.) moves to the probe card receiving position P1. In this state, the holding unit 40*a* is ascended in the Z-axis direction with respect to the Z-axis movable unit 38*a* to come into contact with the probe card PC (outer circumferential edge in the undersurface), and the holding unit 40*a* ascending in the Z-axis direction lifts the probe card PC from the probe card holding arm 16*c*. Thus, the probe card PC is delivered to the holding unit 40*a* and held by the holding unit 40*a* right above the wafer chuck 18. In the meantime, the probe card PC is heated with radiant heat of the wafer chuck 18 below the probe card PC.

Next, the probe card PC and the alignment apparatus 38 holding the wafer chuck 18 heated to the target temperature (here, inspection temperature of 80° C.) are moved to the preheating position P2 (see FIG. 7B). In the meantime, the probe card PC is heated with the radiant heat of the wafer chuck 18 below the probe card PC.

Next, the probe card PC is transferred to the first probe card holding mechanism 36 (see FIG. 7B). Specifically, while the alignment apparatus 38 holding the wafer chuck 18 heated to the target temperature (here, inspection temperature of 80° C.) is moved to the preheating position P2, the Z-axis movable unit 38*a* (second probe card holding mechanism 40) is ascended in the Z-axis direction to thereby transfer the probe card PC held by the second probe card holding mechanism 40 to the first probe card holding mechanism 36. The probe card PC transferred to the first probe card holding mechanism 36 is detachably held by the first probe card holding mechanism 36. In the meantime, the probe card PC is heated with the radiant heat of the wafer chuck 18 below the probe card PC.

As described above, the probe card PC is not only heated in the transfer unit 16 but also continues to be heated (preheated) seamlessly with the radiant heat of the wafer chuck 18 even while a period since the probe card PC is delivered from the probe card holding arm 16*c* till the probe card PC is held by the first probe card holding mechanism 36.

Even when it takes ten to several tens of seconds after the probe card PC heated in the transfer unit 16 is delivered from the probe card holding arm 16*c* until the probe card PC is held by the first probe card holding mechanism 36, it is possible to cause the first probe card holding mechanism 36 to hold the preheated probe card PC without the temperature of the probe card PC decreasing in the middle of the process.

Thus, the environment in the transfer unit 16 (heating the probe card) is controlled using the time during the probe card is transferred from the probe card housing unit 12*b* into the measurement unit 14 which is the transfer destination to reduce the difference from the inspection temperature at the measurement unit 14 which is the transfer destination. Therefore, it is possible to reduce (or eliminate) the standby time for bringing the temperature of the probe card closer to the inspection temperature in the measurement unit 14 which is the transfer destination (for preheating), compared to the prior arts. This makes it possible to improve throughput at the measurement unit 14.

Probe Card Transfer Operation Example 2

Next, below is an explanation about an operation example when the transfer unit 16 transfers the probe card PC which is brought into a high temperature state (e.g., 80° C.) by a high temperature inspection from the measurement unit 14 to the probe card housing unit 12*b* (e.g., room temperature of 23° C.).

First, the probe card holding arm 16*c* takes the probe card PC immediately after the completion of the high temperature inspection out from the measurement unit 14 and houses the probe card PC in the casing 16*a*. This is performed using the reverse procedure of that of the above-described probe card transfer operation example 1. In addition, the environment in the casing 16*a* is controlled so as to become an environment according to the environment (here, room temperature of 23° C.) of the probe card housing unit 12*b* which is the transfer destination. Specifically, a gas whose temperature is adjusted by the temperature adjustment gas supply source (e.g., dry air or nitrogen whose temperature is adjusted to 40° C.) is supplied into the casing 16*a* and injected from the air injection port, thus forming an air curtain that closes the opening 16*f* formed in the casing 16*a*. This causes the casing 16*a* to be in a sealed or substantially sealed state. Note that the target temperature adjusted by the temperature adjustment gas supply source is not limited to 40° C. The target temperature can be set to an appropriate temperature, considering a distance and time for transferring the probe card PC from the measurement unit 14 to the probe card housing unit 12*b* which is the transfer destination, a temperature at the probe card housing unit 12*b* which is the transfer destination, or the like. The probe card PC immediately after the completion of the high temperature inspection is taken out from the measurement unit 14 through the opening 16*f* closed with the air curtain, in a state where the probe card PC is held by the probe card holding arm 16*c*, and the probe card PC is housed in the casing 16*a*. In that case, the probe card PC is cooled by the air curtain blown over the probe card PC and further cooled with the gas supplied into the casing 16*a*.

Next, the transfer unit 16 is moved to a position where the transfer unit 16 can access the probe card housing unit 12*b* which is the transfer destination (position where the probe card PC can be delivered), and the transfer unit 16 is rotated by 180° such that the opening 16*f* formed in the transfer unit 16 through which each arm 16*b* or 16*c* goes in and out faces the probe card housing unit 12*b* which is the transfer destination. In the meantime, the probe card PC housed in the transfer unit 16 continues to be cooled with the gas supplied into the casing 16*a* (sealed or substantially sealed space).

In this way, closing the opening 16*f* not with a physical door or shutter as in the case of the prior arts but with the air curtain can exert effects similar to those in the above-described wafer transfer operation example 1.

Next, the probe card holding arm 16*c* is advanced into the probe card housing unit 12*b* and the probe card PC is returned to the probe card housing unit 12*b*.

Thus, the environment in the transfer unit 16 (cooling the probe card) is controlled using the time during the probe card is transferred from the measurement unit 14 into the probe card housing unit 12*b* which is the transfer destination to reduce the difference from the temperature at the probe card housing unit 12*b* which is the transfer destination. Therefore, it is possible to eliminate (or reduce) the standby time for bringing the temperature of the probe card closer to the normal temperature in the measurement unit 14, compared to the prior arts, and the probe card immediately after the completion of the high temperature inspection can be taken out from the measurement unit 14 and returned to the probe card housing unit 12*b*. This makes it possible to improve throughput at the measurement unit 14. It is also possible to eliminate (or reduce) the waiting time until the operator collects the probe card after housing the probe card.

Probe Card Transfer Operation Example 3

Next, below is an explanation about an operation example when the transfer unit 16 transfers the probe card PC from the probe card housing unit 12$b$ (e.g., room temperature of 23° C.) into the measurement unit 14 at which a low temperature inspection (e.g., inspection temperature of −10° C.) is conducted.

First, the transfer unit 16 is moved to a position where the transfer unit 16 can access the probe card housing unit 12$b$ (position where the probe card can be extracted), and the transfer unit 16 is rotated by 180° such that the opening 16$f$ formed in the transfer unit 16 through which each arm 16$b$ or 16$c$ goes in and out faces the probe card housing unit 12$b$.

Next, the probe card holding arm 16$c$ is advanced into the probe card housing unit 12$b$ to take one probe card PC out from the probe card housing unit 12$b$ and house the probe card PC in the casing 16$a$. In addition, the environment in the casing 16$a$ is controlled so as to become an environment according to the environment of the measurement unit 14 which is the transfer destination (here, low temperature inspection at −10° C. conducted in the measurement unit 14). Specifically, a gas having a temperature or humidity adjusted by the temperature adjustment gas supply source (e.g., dry air or nitrogen whose temperature is adjusted to −15° C.) is supplied into the casing 16$a$ and injected from the air injection port, thus forming an air curtain that closes the opening 16$f$ formed in the casing 16$a$. This causes the casing 16$a$ to be in a sealed or substantially sealed state. Note that the target temperature adjusted by the temperature adjustment gas supply source is not limited to −15° C. The target temperature can be set to an appropriate temperature, considering a distance and time for transferring the probe card PC from the probe card housing unit 12$b$ to the measurement unit 14 which is the transfer destination, an inspection temperature at the measurement unit 14 which is the transfer destination, or the like.

Next, the transfer unit 16 is moved to a position where the transfer unit 16 can access the measurement unit 14 which is the transfer destination (position where the probe card PC can be delivered), and the transfer unit 16 is rotated by 180° such that the opening 16$f$ formed in the transfer unit 16 through which each arm 16$b$ or 16$c$ goes in and out faces the measurement unit 14 which is the transfer destination. In the meantime, the probe card PC housed in the transfer unit 16 continues to be cooled and dried with the gas supplied into the casing 16$a$ (sealed or substantially sealed space). In this way, it is possible to prevent condensation from occurring on the probe card PC while the probe card PC is transferred to the measurement unit 14 which is the transfer destination.

Next, the probe card holding arm 16$c$ is advanced into the measurement unit 14 through the opening 16$f$ on the transfer unit 16 side in which the air curtain is formed and the opening 14$a$ on the measurement unit 14 side (see FIG. 7A). The probe card holding arm 16$c$ passes through the opening 16$f$ which is closed with the air curtain and advances into the measurement unit 14 while holding the probe card PC. In that case, the probe card PC is further cooled and dried by the air curtain blown over it. In this way, it is possible to prevent condensation from occurring on the probe card PC when the probe card PC is delivered.

Thus, closing the opening 16$f$ not with a physical door or shutter as in the case of the prior arts but with the air curtain can exert effects similar to those in the above-described wafer transfer operation example 1.

Next, the holding unit 40$a$ of the second probe card holding mechanism 40 receives the probe card PC from the probe card holding arm 16$c$ and holds the probe card PC. Specifically, in a state where the alignment apparatus 38 which is holding the wafer chuck 18 cooled to a target temperature (here, inspection temperature of −10° C.) has moved to the probe card receiving position P1, the holding unit 40$a$ ascends in the Z-axis direction with respect to the Z-axis movable unit 38$a$ such that the holding unit 40$a$ comes into contact with the probe card PC (outer circumferential edge in the undersurface), and the holding unit 40$a$ ascending in the Z-axis direction lifts the probe card PC from the probe card holding arm 16$c$. The probe card PC is thus delivered to the holding unit 40$a$ and held by the holding unit 40$a$ right above the wafer chuck 18. In the meantime, the probe card PC is cooled by the wafer chuck 18 below the probe card PC.

Next, in a state where the alignment apparatus 38 holds the probe card PC and the wafer chuck 18 which is cooled to the target temperature (here, inspection temperature of −10° C.) is moved to the position P2 (see FIG. 7B). In the meantime, the probe card PC is cooled by the wafer chuck 18 below the probe card PC.

Next, the probe card PC is transferred to the first probe card holding mechanism 36 (see FIG. 7B). Specifically, in a state where the alignment apparatus 38 which is holding the wafer chuck 18 cooled to a target temperature (here, inspection temperature of −10° C.) has moved to the position P2, the Z-axis movable unit 38$a$ (second probe card holding mechanism 40) is ascended in the Z-axis direction and the probe card PC held by the second probe card holding mechanism 40 is transferred to the first probe card holding mechanism 36. The probe card PC transferred to the first probe card holding mechanism 36 is detachably held by the first probe card holding mechanism 36. In the meantime, the probe card PC is cooled by the wafer chuck 18 below the probe card PC.

As described above, the probe card PC is not only cooled in the transfer unit 16 but also continues to be cooled seamlessly by the wafer chuck 18 while the probe card PC is delivered from the probe card holding arm 16$c$ until the probe card PC is held by the first probe card holding mechanism 36.

Thus, even when it takes ten to several tens of seconds after the probe card PC cooled in the transfer unit 16 is delivered from the probe card holding arm 16$c$ until the probe card PC is held by the first probe card holding mechanism 36, it is possible to cause the first probe card holding mechanism 36 to hold the cooled probe card PC without the temperature of the probe card PC increasing in the middle of the process. Note that a gas having a dew point which would not produce condensation at the cooling temperature of the wafer or probe card (e.g., dry air at 20° C.) is supplied into the measurement unit 14 which is the transfer destination, using known means.

Thus, the environment in the transfer unit 16 (cooling the wafer) is controlled using the time during the probe card is transferred from the probe card housing unit 12$b$ into the measurement unit 14 which is the transfer destination to reduce the difference from the inspection temperature at the measurement unit 14 which is the transfer destination. Therefore, it is possible to reduce (or eliminate) the standby time for bringing the temperature of the probe card closer to the inspection temperature in the measurement unit 14 which is the transfer destination, compared to the prior arts. This makes it possible to improve throughput at the measurement unit 14.

Probe Card Transfer Operation Example 4

Next, below is an explanation about an operation example when the transfer unit 16 transfers the probe card PC brought into a low temperature state (e.g., −40° C.) due to a low temperature inspection from the measurement unit 14 into the probe card housing unit 12*b* (e.g., room temperature of 23° C.).

First, the probe card holding arm 16*c* takes the probe card PC immediately after the completion of the low temperature inspection out from the measurement unit 14 and houses the probe card PC in the casing 16*a*. This is performed using the reverse procedure of that in the above-described wafer transfer operation example 3. In addition, the environment in the casing 16*a* is controlled so as to become an environment according to the environment (here, room temperature of 23° C.) of the probe card housing unit 12*b* which is the transfer destination. Specifically, the gas whose temperature or humidity is adjusted by the temperature adjustment gas supply source (e.g., dry air or nitrogen whose temperature is adjusted to 15° C.) is supplied into the casing 16*a* and injected from the air injection port, thus forming an air curtain that closes the opening 16*f* formed in the casing 16*a*. This causes the casing 16*a* to be in a sealed or substantially sealed state. Note that the target temperature adjusted by the temperature adjustment gas supply source is not limited to 15° C. The target temperature can be set to an appropriate temperature, considering a distance and time for transferring the probe card PC from the measurement unit 14 to the probe card housing unit 12*b* which is the transfer destination, a temperature at the probe card housing unit 12*b* which is the transfer destination, or the like. The probe card PC immediately after the completion of the low temperature inspection is taken out from the measurement unit 14 through the opening 16*f* closed with the air curtain, in a state where held by the probe card holding arm 16*c*, and the probe card PC is housed in the casing 16*a*. In that case, the probe card PC is heated by the air curtain blown over the probe card PC and is further heated with the gas supplied into the casing 16*a*. This can prevent condensation from occurring on the probe card PC when the probe card PC is delivered.

Next, the transfer unit 16 is moved to a position where the transfer unit 16 can access the probe card housing unit 12*b* which is the transfer destination (position where the probe card PC can be delivered), and the transfer unit 16 is rotated by 180° such that the opening 16*f* formed in the transfer unit 16 through which each arm 16*b* or 16*c* goes in and out faces the probe card housing unit 12*b* which is the transfer destination. In the meantime, the probe card PC housed in the transfer unit 16 continues to be heated with the gas supplied into the casing 16*a* (sealed or substantially sealed space). This can prevent condensation from occurring on the probe card PC while the probe card PC is being transferred to the probe card housing unit 12*b*.

In this way, closing the opening 16*f* not with a physical door or shutter as in the case of the prior arts but with the air curtain can exert effects similar to those in the above-described wafer transfer operation example 1.

Next, the probe card holding arm 16*c* is advanced into the probe card housing unit 12*b* and the probe card PC is returned to the probe card housing unit 12*b*.

Thus, the environment in the transfer unit 16 (heating the probe card) is controlled using the time during the probe card is transferred from the measurement unit 14 into the probe card housing unit 12*b* which is the transfer destination to reduce the difference from the temperature at the probe card housing unit 12*b* which is the transfer destination. Therefore, it is possible to eliminate (or reduce) the standby time for bringing the temperature of the probe card closer to the normal temperature in the measurement unit 14, compared to the prior arts, and the probe card immediately after the completion of the low temperature inspection can be taken out from the measurement unit 14 and returned to the probe card housing unit 12*b*. This makes it possible to improve throughput at the measurement unit 14. It is also possible to adjust the temperature environment to one that prevents condensation from occurring on the probe card by the time the probe card is transferred into the probe card housing unit 12*b*.

Probe Card Transfer Operation Example 5

Next, below is an explanation about an operation example when the transfer unit 16 transfers the probe card PC from the probe card housing unit 12*b* (e.g., room temperature of 23° C.) into the measurement unit 14 at which an inspection is conducted under a predetermined gas (e.g., nitrogen gas) atmosphere.

First, the transfer unit 16 is moved to a position where the transfer unit 16 can access the probe card housing unit 12*b* (position where the probe card PC can be extracted), and the transfer unit 16 is rotated by 180° such that the opening 16*f* formed in the transfer unit 16 through which each arm 16*b* or 16*c* goes in and out faces the probe card housing unit 12*b*.

Next, the probe card holding arm 16*c* is advanced into the probe card housing unit 12*b* to take one probe card PC out from the probe card housing unit 12*b* and house the probe card PC in the casing 16*a*. In addition, the environment in the casing 16*a* is controlled so as to become an environment according to the environment (here, an inspection under a predetermined gas (e.g., nitrogen gas) atmosphere) of the measurement unit 14 which is the transfer destination. Specifically, a gas (e.g., nitrogen gas) for oxidation prevention of wiring exposed on the wafer surface (particularly, copper wiring) and the probe of the probe card is supplied into the casing 16*a* and injected from the air injection port, thus forming an air curtain that closes the opening 16*f* formed in the casing 16*a*. This causes the casing 16*a* to be in a sealed or substantially sealed state.

Next, the transfer unit 16 is moved to a position where the transfer unit 16 can access the measurement unit 14 which is the transfer destination (position where the probe card PC can be delivered), and the transfer unit 16 is rotated by 180° such that the opening 16*f* formed in the transfer unit 16 through which each arm 16*b* or 16*c* goes in and out faces the measurement unit 14 which is the transfer destination. In the meantime, the oxidation prevention gas continues to be supplied into the transfer unit 16 (sealed or substantially sealed space). This can prevent the probe card PC from being oxidized while being transferred to the measurement unit 14 which is the transfer destination. Note that the oxidation prevention gas is also supplied into the measurement unit 14 which is the transfer destination using known means.

Next, the probe card holding arm 16*c* is advanced into the measurement unit 14 through the opening 16*f* on the transfer unit 16 side where the air curtain is formed and the opening 14*a* on the measurement unit 14 side. The probe card holding arm 16*c* passes through the opening 16*f* closed with the air curtain and advances into the measurement unit 14 in a state where the probe card holding arm 16c is holding the probe card PC. In that case, the air curtain prevents the probe card PC from being oxidized.

Thus, closing the opening 16f not with a physical door or shutter as in the case of the prior arts but with the air curtain can exert effects similar to those in the above-described wafer transfer operation example 1.

Hereinafter, the probe card PC is transferred to the first probe card holding mechanism 36 using a procedure similar to those in the above-described probe card transfer operation examples 1 and 3, and is detachably held by the first probe card holding mechanism 36.

Thus, even while the probe card is being transferred from the probe card housing unit 12b into the measurement unit 14 which is the transfer destination, since the probe card is still left in an environment similar to that of the measurement unit 14 at which an inspection is conducted under a predetermined gas (e.g., nitrogen gas) atmosphere, it is possible to prevent the probe of the probe card from being oxidized during transfer and delivery.

Note that the present operation example 5 can also be implemented in combination with the above-described probe card transfer operation examples 1 to 4.

As described above, the present embodiment can provide the prober 10 equipped with the transfer unit 16 that moves between the transfer object housing 12 and the plurality of measurement units 14 to transfer a transfer object (e.g., at least one of a wafer and a probe card) to the transfer object housing 12 or each of the measurement units 14, the prober being capable of improving throughput at each of the measurement units 14.

The present embodiment can provide such a prober because it is possible to control the environment (e.g., temperature or humidity) in the transfer unit 16 (casing 16a) using the time until the transfer object is transferred to the transfer destination (measurement unit 14 or transfer object housing 12), and reduce (or eliminate) the standby time for bringing the temperature of the transfer object closer to a predetermined temperature (e.g., inspection temperature or normal temperature) in each measurement unit, compared to the prior arts.

Furthermore, since the present embodiment adopts a configuration that controls not the environment of the entire prober 10 but the environment in the casing 16a which is smaller than the entire prober 10, that is, since the environment in the casing 16a is controlled in a localized manner, it is possible to implement energy saving compared to the case where the environment of the entire prober 10 is controlled. Furthermore, the amount of gas (dry air or nitrogen gas) supplied into the casing 16a can be reduced.

Furthermore, according to the present embodiment, it is possible to minimize the area of installation of the prober 10. It is also possible to minimize the time for the transfer unit 16 to access the transfer object housing 12 or each of the measurement units 14.

This is because the transfer object housing 12 and each of the measurement units 14 are arranged at a certain interval in the Y-direction with surfaces on the sides accessed by the transfer unit 16 facing each other (that is, a mutually facing state), and because the transfer unit 16 is arranged between the transfer object housing 12 and each of the measurement units 14.

As described above, the present embodiment can provide the prober 10 equipped with the transfer unit 16 which is provided with the casing 16a that houses a transfer object (e.g., at least one of a wafer and a probe card), and that has the opening 16f through which the transfer object goes in and out, the transfer unit 16 moving to a delivery destination of the transfer object to deliver the transfer object to/from the delivery destination of the transfer object through the opening 16f, in which the interior of the casing 16a that houses the transfer object can be sealed and the transfer object can be speedily delivered without the need for any physical door or mechanism for opening/closing the physical door.

This is implemented by providing the air curtain formation means 42 that forms the air curtain that closes the opening 16f and causes the casing 16a to be in a sealed or substantially sealed state.

Furthermore, the present embodiment can provide the prober 10 equipped with the transfer unit 16 that moves between the transfer object housing 12 and the plurality of measurement units 14 to transfer a transfer object (e.g., at least one of a wafer and a probe card) to the transfer object housing 12 or each of the measurement units 14, the prober being capable of improving throughput at each of the measurement units 14.

This is because the environment (e.g., temperature or humidity) in the transfer unit 16 (casing 16a) is controlled using the time until the transfer object is transferred to the transfer destination (measurement unit 14 or transfer object housing 12), and because it is thereby possible to reduce (or eliminate) the standby time for bringing the temperature of the transfer object closer to a predetermined temperature (e.g., inspection temperature or normal temperature) in each measurement unit, compared to the prior arts.

According to the present embodiment, even when it takes ten to several tens of seconds until the probe card PC heated in the transfer unit 16 is delivered from the probe card holding arm 16c and held by the first probe card holding mechanism 36, it is possible to cause the first probe card holding mechanism 36 to hold the preheated probe card PC without the temperature of the probe card PC decreasing in the middle of the process.

This is because the probe card PC continues to be seamlessly heated (preheated) with radiant heat of the wafer chuck 18 not only while the probe card PC is heated in the transfer unit 16 (casing 16a), but also until the probe card PC is delivered from the probe card holding arm 16c and held by the first probe card holding mechanism 36.

Furthermore, since the present embodiment adopts a configuration that controls not the environment of the entire prober 10 but the environment in the casing 16a which is smaller than the entire prober 10, that is, the environment in the casing 16a is controlled in a localized manner, it is possible to implement energy saving compared to the case where the environment of the entire prober 10 is controlled. Furthermore, the amount of gas (dry air or nitrogen gas) supplied into the casing 16a can be reduced.

Furthermore, the present embodiment can minimize the area of installation of the prober 10. The present embodiment can also minimize the time for the transfer unit 16 to access the transfer object housing 12 or each of the measurement units 14.

This is because the transfer object housing 12 and each of the measurement units 14 are arranged at a certain interval in the Y-direction with surfaces on the sides accessed by the transfer unit 16 facing each other (that is, a mutually facing state) and because the transfer unit 16 is arranged between the transfer object housing 12 and each of the measurement units 14.

Next, another embodiment of the transfer unit 16 is described.

Figure 8:
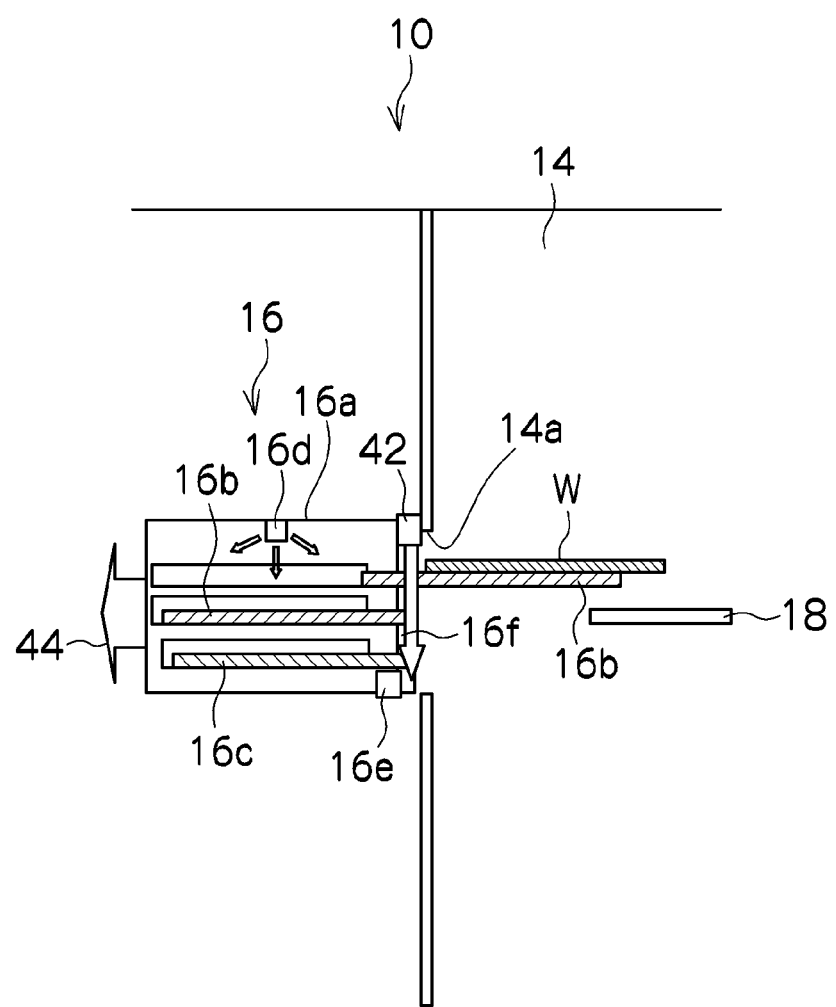
FIG. 8 is a longitudinal cross-sectional view illustrating a schematic configuration of the transfer unit.

FIG. 8 is a longitudinal cross-sectional view illustrating a schematic configuration of the transfer unit 16 according to another embodiment. Note that parts already described in FIG. 4 are denoted by the same reference numerals and description thereof is omitted.

The transfer unit 16 shown in FIG. 8 is provided with the environment controller 16d and the air curtain formation means 42 as separate bodies. Since the environment controller 16d and the air curtain formation means 42 are provided as separate (independent) bodies in this way, it is possible to operate the environment controller 16d and the air curtain formation means 42 independently of each other. For example, it is possible to operate the environment controller 16d and the air curtain formation means 42 independently of each other such that the environment controller 16d controls the environment in the casing 16a with hot air while the air curtain formation means 42 closes the opening 16f with cold air. Furthermore, when the environment controller 16d and the air curtain formation means 42 are provided as separate bodies, the environment controller 16d may be provided on the top surface of the interior of the casing 16a, and the environment controller 16d can thereby control the environment in the casing 16a efficiently. Furthermore, when the environment controller 16d and the air curtain formation means 42 are provided as separate bodies, by providing the environment controller 16d at substantially the center of the top surface of the casing 16a, the environment controller 16d can control the environment in the casing 16a more efficiently. Here, "substantially the center" does not always mean a precise center but also means the vicinity of the center or near the center.

Next, variant examples will be described.

The present embodiment has described a configuration in which each arm 16b or 16c of the transfer unit 16 goes in and out through the opening 16f formed in the casing 16a. However, the present invention is not limited to this configuration. It is also possible to adopt, for example, a configuration in which a similar opening (not shown) is formed on a surface on the side opposite to the side in which the opening 16f of the casing 16a of the transfer unit 16 is formed so that each arm 16b or 16c reciprocates in the horizontal direction individually and goes in and out through the opening 16f and the opening on the opposite side. By adopting this configuration, it is possible to omit the transfer unit rotation mechanism 28. Each arm 16b or 16c can access the transfer object housing 12 or each of the measurement units 14 despite the omission of the transfer unit rotation mechanism 28, that is, without rotating the transfer unit 16. In this case, by providing the transfer unit 16 with similar air curtain formation means configured to form an air curtain that closes an opening formed on the opposite side of the opening 16f in addition to the air curtain formation means 42 that forms the air curtain that closes the opening 16f formed in the casing 16a of the transfer unit 16, it is possible to cause the casing 16a to be in a sealed or substantially sealed state and exert effects similar to those in the above-described embodiment.

The present embodiment has described a configuration in which each of the measurement units 14 is arranged two-dimensionally in the horizontal direction (X-axis direction) and the vertical direction (Z-axis direction), but the present invention is not limited to this configuration. Each of the measurement units 14 may be arranged in only one row in the horizontal direction (X-axis direction) or may be arranged in only one row in the vertical direction (Z-axis direction). By arranging each of the measurement units 14 in only one row in the horizontal direction (X-axis direction), the second movable body moving mechanism can be omitted. By arranging each of the measurement units 14 in only one row in the vertical direction (Z-axis direction), the first movable body moving mechanism can be omitted.

The present embodiment has described a configuration using one transfer unit 16 and one moving device 22, but the present invention is not limited to this configuration. A plurality of transfer units 16 and a plurality of moving devices 22 may be used. By adopting this configuration, it is possible to further improve throughput at each of the measurement units 14.

The present embodiment has described a configuration using the wafer holding arm 16b and the probe card holding arm 16c, but the present invention is not limited to this configuration. Only the wafer holding arm 16b may be used or only the probe card holding arm 16c may be used.

The present embodiment has described a configuration in which the transfer unit 16 is provided with the respective arms 16b and 16c, but the present invention is not limited to this configuration. The respective arms 16b and 16c (or arm corresponding thereto) may be provided on the transfer object housing 12 side and on the respective measurement units 14 sides. This also makes it possible to take the transfer object out from the transfer object housing 12 or the measurement unit 14 by each arm, house the transfer object in the transfer unit 16, as well as to take the transfer object out from the transfer unit 16 and deliver the transfer object to the transfer object housing 12 or the measurement unit 14.

The present embodiment has described a configuration in which the opening 16f formed in the casing 16a is closed with the air curtain, but the present embodiment is not limited to this configuration. Opening opening/closing means such as a shutter or door that is opened when the transfer object is taken or delivered and closed during transfer of the transfer object may be provided in the transfer unit 16 and this opening opening/closing means may open/close the opening 16f. Moreover, the opening 14a formed in each of the measurement units 14 may be configured to be closed with a similar air curtain. Or, similar opening opening/closing means may be configured to open/close the opening 14a.

As described above, the concept of controlling the environment in the transfer unit (casing) so as to become an environment according to the environment of the transfer destination of the transfer object using the time until the transfer object is transferred to the transfer destination (measurement unit or transfer object housing) is applicable not only to the prober in the above-described embodiment but also to probers equipped with all types of transfer units that move between the transfer object housing and a plurality of measurement units to transfer a transfer object to the transfer object housing or the plurality of measurement units (e.g., self-propelled chassis described in Japanese Patent Application Laid-Open No. H5-343497).

As described above, the concept of closing the opening formed in the transfer unit (casing that houses the transfer object) through which the transfer object goes in and out not with a physical door or shutter as in the case of the prior arts but with an air curtain is applicable not only to the prober in the above-described embodiment. The concept is also applicable to probers equipped with all types of transfer units including a casing that houses the transfer object and that is provided with an opening through which the transfer object goes in and out, the transfer units moving to the delivery destination of the transfer object to deliver the transfer object to/from the delivery destination of the transfer object through the opening (e.g., card transfer chassis described in Japanese Patent Application Laid-Open No. 2007-294665).

The concept of controlling the environment in the transfer unit (casing) so as to become an environment according to the environment of the transfer destination of the transfer object using the time until the transfer object is transferred to the transfer destination (measurement unit or transfer object housing) is applicable not only to the prober in the above-described embodiment. The concept is also applicable to probers equipped with all types of transfer units that move between the transfer object housing and a plurality of measurement units to transfer the transfer object to the transfer object housing or a plurality of measurement units (e.g., self-propelled chassis described in Japanese Patent Application Laid-Open No. H5-343497).

The concept of seamlessly heating (preheating) the probe card with radiant heat of the wafer chuck within the transfer unit (casing) as well as until the transfer object is delivered from the probe card holding arm and held by the first probe card holding mechanism is applicable not only to the prober in the above-described embodiment. The concept is also applicable to all types of probers equipped with an alignment apparatus that moves between a probe card receiving position and a preheating position below the first probe card holding mechanism.

The prober according to the present invention has been described in detail so far, but the present invention is not limited to the above-described embodiments and as a matter of course, various improvements and modifications may be made without departing from the spirit and scope of the present invention.

REFERENCE SIGNS LIST

10 . . . prober, 12 . . . transfer object housing, 12a . . . wafer housing unit, 12b . . . probe card housing unit, 14 . . . measurement unit, 14a . . . opening, 16 . . . transfer unit, 16a . . . casing, 16b . . . wafer holding arm, 16c . . . probe card holding arm, 16d . . . environment controller, 16e . . . sensor, 16f . . . opening, 18 . . . wafer chuck, 20 . . . head stage, 22 . . . moving device, 24 . . . first movable body, 26 . . . second movable body, 28 . . . transfer unit rotation mechanism, 28a . . . drive motor, 30, 32 . . . guide rail, 34 . . . base, 36 . . . probe card holding mechanism, 38 . . . alignment apparatus, 38a . . . Z-axis movable unit, 38b . . . Z-axis fixing unit, 38c . . . XY movable unit, 40 . . . probe card holding mechanism, 40a . . . holding unit, 42 . . . air curtain formation means, CH . . . card holder, PC . . . probe card, W . . . wafer

What is claimed is:

1. A prober comprising:
a measurement unit;
a transfer unit configured to transfer a transfer object to the measurement unit, the transfer unit being distinct and separate from the measurement unit, the transfer unit including a casing configured to house the transfer object therein; and
an environment controller provided in the transfer unit, and configured to control an environment in the casing so as to be closer to an environment of the measurement unit.

2. A prober comprising:
a transfer object housing;
a transfer unit configured to transfer a transfer object to the transfer object housing, the transfer unit being distinct and separate from the transfer object housing, the transfer unit including a casing configured to house the transfer object therein; and
an environment controller provided in the transfer unit, and configured to control an environment in the casing so as to be closer to an environment of the transfer object housing.

3. A prober comprising:
a measurement unit;
a transfer object housing;
a transfer unit configured to transfer a transfer object between the transfer object housing and the measurement unit, the transfer unit being distinct and separate from the measurement unit and the transfer object housing, the transfer unit including a casing configured to house the transfer object therein; and
an environment controller provided in the transfer unit, and configured to control an environment in the casing,
wherein the environment controller controls the environment in the casing so as to be closer to an environment of the measurement unit when the transfer object is transferred to the measurement unit, and
wherein the environment controller controls the environment in the casing so as to be closer to an environment of the transfer object housing when the transfer object is transferred to the transfer object housing.

4. A prober comprising:
a measurement unit;
a transfer unit configured to transfer a transfer object to the measurement unit, the transfer unit being distinct and separate from the measurement unit, the transfer unit including a casing configured to house the transfer object therein; and
an environment controller provided in the transfer unit, and configured to control an environment in the casing such that a temperature in the casing becomes closer to an inspection temperature of the measurement unit.

5. The prober according to claim 1, wherein
the transfer unit includes an air curtain formation unit configured to form an air curtain so as to close an opening through which the transfer object housed in the casing is taken in and out, and
a direction along which the air curtain is formed is orthogonal to a direction along which the transfer object housed in the casing is taken in and out.

6. The prober according to claim 2, wherein
the transfer unit includes an air curtain formation unit configured to form an air curtain so as to close an opening through which the transfer object housed in the casing is taken in and out, and
a direction along which the air curtain is formed is orthogonal to a direction along which the transfer object housed in the casing is taken in and out.

7. The prober according to claim 3, wherein
the transfer unit includes an air curtain formation unit configured to form an air curtain so as to close an opening through which the transfer object housed in the casing is taken in and out, and
a direction along which the air curtain is formed is orthogonal to a direction along which the transfer object housed in the casing is taken in and out.

8. The prober according to claim 4, wherein
the transfer unit includes an air curtain formation unit configured to form an air curtain so as to close an opening through which the transfer object housed in the casing is taken in and out, and
a direction along which the air curtain is formed is orthogonal to a direction along which the transfer object housed in the casing is taken in and out.

9. The prober according to claim 5, wherein
the environment controller and the air curtain formation unit are integrally provided.

10. The prober according to claim 6, wherein
the environment controller and the air curtain formation unit are integrally provided.

11. The prober according to claim 7, wherein
the environment controller and the air curtain formation unit are integrally provided.

12. The prober according to claim 8, wherein
the environment controller and the air curtain formation unit are integrally provided.

13. The prober according to claim 9, wherein
at least one of a temperature adjustment gas supply source and an air blower is shared between the environment controller and the air curtain formation unit.

14. The prober according to claim 10, wherein
at least one of a temperature adjustment gas supply source and an air blower is shared between the environment controller and the air curtain formation unit.

15. The prober according to claim 11, wherein
at least one of a temperature adjustment gas supply source and an air blower is shared between the environment controller and the air curtain formation unit.

16. The prober according to claim 12, wherein
at least one of a temperature adjustment gas supply source and an air blower is shared between the environment controller and the air curtain formation unit.

* * * * *